(12) United States Patent
Chang et al.

(10) Patent No.: US 7,567,153 B2
(45) Date of Patent: Jul. 28, 2009

(54) COMPACT BANDPASS FILTER FOR DOUBLE CONVERSION TUNER

(75) Inventors: Sung-Hsien Chang, Irvine, CA (US); Ramon A. Gomez, San Juan Capistrano, CA (US); Lawrenece M. Burns, Laguna Hills, CA (US); Carl W. Pobanz, Topanga, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/892,097

(22) Filed: Aug. 20, 2007

(65) Prior Publication Data

US 2008/0036557 A1 Feb. 14, 2008

Related U.S. Application Data

(63) Continuation of application No. 10/295,985, filed on Nov. 18, 2002, now Pat. No. 7,375,604, which is a continuation-in-part of application No. 10/040,376, filed on Jan. 9, 2002, now Pat. No. 7,084,720.

(51) Int. Cl.
*H01P 1/203* (2006.01)

(52) U.S. Cl. ........................................ 333/204; 333/205

(58) Field of Classification Search ................. 333/202, 333/203, 204, 205
See application file for complete search history.

(56) References Cited

U.S. PATENT DOCUMENTS

| | | | |
|---|---|---|---|
| 4,418,324 A | 11/1983 | Higgins | |
| 4,423,396 A | 12/1983 | Makimoto et al. | |
| 4,488,130 A | 12/1984 | Young et al. | |
| 4,740,765 A | 4/1988 | Ishikawa et al. | |
| 4,757,285 A | 7/1988 | Krause | |
| 4,801,905 A | 1/1989 | Becker | |
| 4,881,043 A | 11/1989 | Jason | |
| 5,192,926 A | 3/1993 | Sogo et al. | |
| 5,739,193 A | 4/1998 | Walpita et al. | |
| 5,825,263 A | 10/1998 | Falt | |
| 5,896,073 A | 4/1999 | Miyazaki et al. | |

(Continued)

FOREIGN PATENT DOCUMENTS

DE 31 32 930 A1 3/1983

(Continued)

OTHER PUBLICATIONS

Kuo, J.-T., et al., "Microstrip Elliptic Function Filters with Compact Miniaturized Hairpin Resonators," IEEE, pp. 861-864 (1999).

(Continued)

*Primary Examiner*—Benny Lee
*Assistant Examiner*—Kimberly E Glenn
(74) *Attorney, Agent, or Firm*—Sterne, Kessler, Goldstein & Fox PLLC

(57) ABSTRACT

A bandpass filter includes a plurality of resonators. An input pin is connected to a first resonator of the plurality of resonators. An output pin is connected to a second resonator of the plurality of resonators. The first and second resonators are magnetically coupled to each other. The first and second resonators are coupled to other resonators using mixed coupling. The other resonators are coupled to each other using electric coupling.

29 Claims, 23 Drawing Sheets

U.S. PATENT DOCUMENTS

| | | | |
|---|---|---|---|
| 5,949,295 | A | 9/1999 | Schmidt |
| 5,955,931 | A | 9/1999 | Kaneko et al. |
| 5,986,525 | A | 11/1999 | Sasaki et al. |
| 6,100,761 | A | 8/2000 | Ezell |
| 6,108,569 | A | 8/2000 | Shen |
| 6,130,189 | A | 10/2000 | Matthaei |
| 6,130,591 | A * | 10/2000 | Tsuzuki .................... 333/204 |
| 6,191,665 | B1 | 2/2001 | Chan et al. |
| 6,252,476 | B1 | 6/2001 | Maloratsky |
| 6,259,752 | B1 | 7/2001 | Domino et al. |
| 6,288,609 | B1 | 9/2001 | Brueske et al. |
| 6,411,181 | B1 | 6/2002 | Ishikawa et al. |
| 6,438,394 | B1 | 8/2002 | Zhang et al. |
| 6,448,640 | B2 | 9/2002 | Corisis |
| 6,448,873 | B1 | 9/2002 | Mostov |
| 6,486,754 | B1 | 11/2002 | Hidaka et al. |
| 6,496,710 | B1 * | 12/2002 | Tsuzuki .................... 505/210 |
| 6,522,217 | B1 | 2/2003 | Shen |
| 6,597,265 | B2 | 7/2003 | Liang et al. |
| 6,639,909 | B1 | 10/2003 | Sakuma |
| 6,700,459 | B2 | 3/2004 | Raihn et al. |
| 6,771,774 | B1 | 8/2004 | Phan et al. |
| 7,071,798 | B2 | 7/2006 | Gomez et al. |
| 7,084,720 | B2 | 8/2006 | Gomez et al. |
| 7,375,604 | B2 | 5/2008 | Chang et al. |
| 2003/0128084 | A1 | 7/2003 | Chang et al. |

FOREIGN PATENT DOCUMENTS

| | | |
|---|---|---|
| EP | 0 506 476 A1 | 9/1992 |
| JP | 5-308204 A | 11/1993 |
| JP | 8-65007 A | 3/1996 |
| JP | 10-190306 A | 7/1998 |
| JP | 11-317603 A | 11/1999 |

OTHER PUBLICATIONS

European Patent Office English-language Abstract for JP 05308204, published Nov. 19, 1993, 1 page.

European Patent Office English-language Abstract for JP 08065007, published Mar. 8, 1996, 1 page.

European Patent Office English-language Abstract for JP 11317603, published Nov. 16, 1999, 1 page.

European Search Report from European Patent Application No. 03250090.2, dated Jan. 14, 2004, 3 pages.

Matthaei, G. et al., *Microwave Filters, Impedance-Matching Networks and Coupling Structures*, Artech House, Inc., Dedham, MA, entire book submitted (1980).

Hong et al., "Cross-Coupled Microstrip Hairpin-Resonator Filters," IEEE Transactions on Microwave Theory and Techniques, vol. 46, No. 1, Jan. 1998, pp. 118-122.

Atia et al., "Narrow-Bandpass Waveguide Filters," IEEE Transactions on Microwave Theory and Techniques, vol. MTT-20, No. 4, Apr. 1972, pp. 258-265.

Matthaei et al., "Hairpin-Comb Filters for HTS and Other Narrow-Band Applications," IEEE Transactions on Microwave Theory and Techniques, vol. 45, No. 8, Aug. 1997, pp. 1226-1231.

European Examination mailed Aug. 21, 2008, for European Application No. 03250090.2-2220, 4 pgs.

English abstract for publication No. DE 31 32 930 A1 published Mar. 3, 1983, 1 pg (printed from esp@cenet database on Feb. 11, 2009).

English abstract for publication No. JP 10-190306 A published Jul. 21, 1998, 1 pg (printed from esp@cenet database on Feb. 11, 2009.

* cited by examiner

COMPACT BANDPASS FILTER FOR DOUBLE CONVERSION TUNER

CROSS-REFERENCE TO RELATED APPLICATIONS

This application is a continuation of U.S. patent application Ser. No. 10/295,985, filed Nov. 18, 2002, which is a continuation-in-part of U.S. patent application Ser. No. 10/040,376, filed Jan. 9, 2002, which are both incorporated by reference herein in their entireties.

BACKGROUND OF THE INVENTION

1. Field of the Invention

The present invention relates generally to radio frequency signal filters, and more specifically to printed circuit bandpass filters.

2. Background Art

Television tuners can be classified by the type of circuit used to select the desired television channel. The predominant circuit architectures in use today are single conversion and double conversion television tuners.

Single conversion tuners usually require preselection filtering. The preselector must be a tracking bandpass filter in order to reject the image channel, which occurs at twice the intermediate frequency (IF) from the desired television channel frequency. Tracking filters require expensive manual tuning during the assembly process. Tracking filters can have significant variations in amplitude response over the desired television channel bandwidth. These variations are undesirable in both analog and digital television systems. Tracking filters are also particularly difficult to implement at the upper end of the television band, where the difference between the desired television channel frequency and the image frequency is a small fraction of the desired television frequency. Removing the image channel, under these conditions, requires a bandpass filter with high selectivity.

Double conversion tuners convert the incoming television signal to a high IF, where most of the out-of-band signals are removed by a narrow bandpass filter. This high IF bandpass filter is usually implemented as either a surface acoustic wave (SAW) filter or a manually-tuned LC filter. The high IF bandpass filter passes a few channels, out of more than 100 channels in the television band. A second conversion brings this relatively narrowband signal composed of a few channels down to the standard television IF at about 40 MHz. A second SAW or LC filter eliminates the remaining undesired channels.

There are several advantages to the double conversion tuner. First, a tracking filter is not required for image rejection. It is easier to obtain a high level of image rejection with the double conversion approach, because a fixed surface acoustic wave and a fixed LC filter can be much more selective than a tracking LC filter. Second, by tuning coarsely with the first broad tuning local oscillator, and fine-tuning with the second narrow tuning local oscillator, the necessary complexity of both phase-locked loops can be substantially reduced.

The high IF bandpass filter, which is usually centered a few hundred megahertz above the upper limit of the television band, must be wide enough to pass the desired television channel under all conditions of center-frequency manufacturing tolerance; center-frequency temperature and other environmental drift; and the variability of the high IF center frequency due to coarseness in tuning the first local oscillator.

Each of the described high IF filters have disadvantages. A fixed LC filter is composed of lumped element capacitors and inductors. Variations in the values of these components and variations in the characteristics of the underlying substrate cause a shift in the filter's characteristics, center frequency, bandwidth, etc., during fabrication. To compensate, lumped element filters must be tuned after fabrication. Tuning raises the cost and complexity of the filter assembly process.

Surface acoustic wave (SAW) filters do not require post fabrication tuning. However, SAW filters are relatively expensive and costly to integrate into new circuit designs, and cannot be fabricated at generic printed circuit board facilities.

What is needed is a passive bandpass filter that exhibits high selectivity, low input loss, low output loss, and good image channel rejection. This new filter should also be inexpensive, capable of manufacture at generic printed circuit board facilities and not require post fabrication tuning.

BRIEF SUMMARY OF THE INVENTION

Accordingly, the present invention is directed to a compact bandpass filter for double conversion tuner that substantially obviates one or more of the problems and disadvantages of the related art.

There is provided a bandpass filter including a plurality of resonators. An input pin is connected to a first resonator of the plurality of resonators. An output pin is connected to a second resonator of the plurality of resonators. The first and second resonators are magnetically coupled to each other. The first and second resonators are coupled to other resonators using mixed coupling. The other resonators are coupled to each other using electric coupling.

In another aspect there is provided a bandpass filter including a first resonator magnetically coupled to a second resonator. A third resonator is electrically coupled to a fourth resonator. The third and fourth resonators are coupled to the first and second resonators, respectively, using mixed coupling. An input pin and an output pin are connected to first and second resonators, respectively.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE FIGURES

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to the preferred embodiments of the present invention, examples of which are illustrated in the accompanying drawings.

Example of a Tuner Application

Before describing the invention in detail, it is useful to describe an example tuner environment for the invention. The printed bandpass filter invention is not limited to the tuner environment that is described herein, as the bandpass filter is applicable to other tuner and non-tuner applications, as will be understood to those skilled in the relevant arts based on the discussions below.

Figure 1:
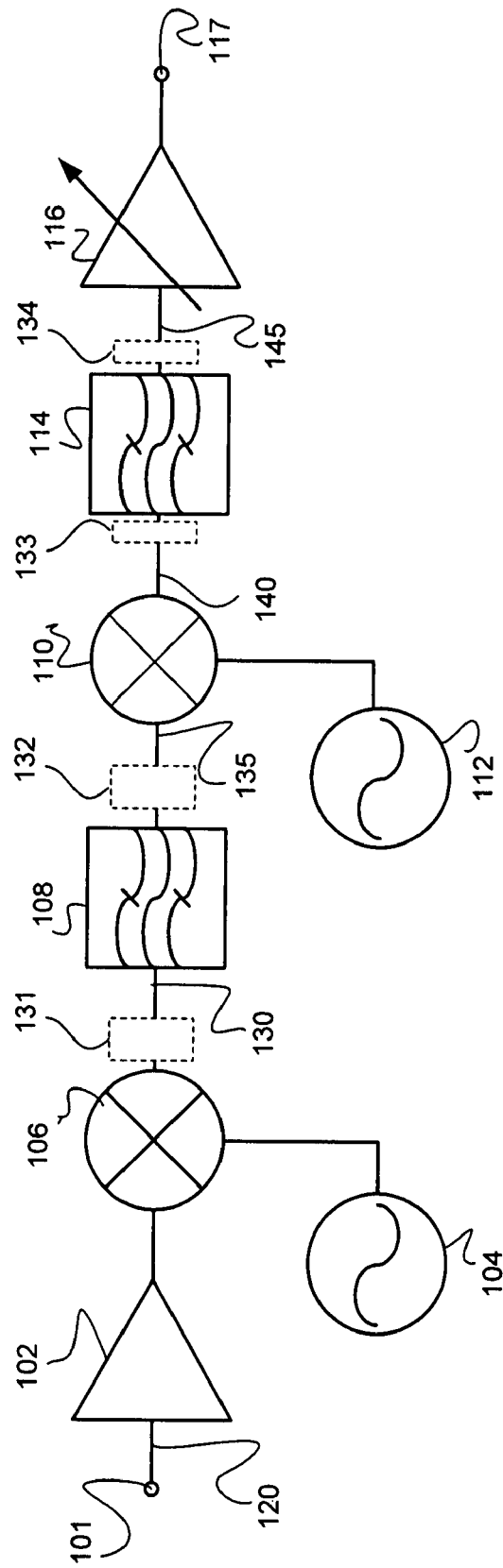
FIG. 1 illustrates a double conversion tuner.

FIG. 1 illustrates a double conversion tuner 100. The double conversion tuner 100 comprises a low noise amplifier 102 coupled to a first mixer 106 (sometimes referred to as frequency translator) and a tuner input 101. The first mixer 106 is also coupled to a first local oscillator 104 that provides an oscillation frequency. A high IF bandpass filter 108 is coupled to the first mixer 106 and a second mixer 110. The second mixer 110 is coupled to a second local oscillator 112 and a second IF bandpass filter 114. A variable gain amplifier 116 is coupled to the second IF bandpass filter 114 and the tuner output 117.

The low noise amplifier 102 amplifies a radio frequency (RF) signal 120 present at the tuner input 101 and sends it to the first mixer 106. In an embodiment, the RF signal 120 is a television signal between approximately 50 and 850 megahertz. The first mixer 106 combines the RF signal 120 with the output of the first local oscillator 104 and outputs a high IF signal 130. The high IF signal 130 comprises a signal at approximately 1220 megahertz and an image channel component at approximately 1130 megahertz. The high IF bandpass filter 108 is a bandpass filter with its passband centered at approximately 1220 megahertz. The high IF signal 130 is filtered by the high IF bandpass filter 108. The high IF bandpass filter 108 removes the image channel component and most of the undesired television channels. After filtering, the high IF signal 130 becomes a high filtered IF signal 135. The high filtered IF signal 135 is mixed with the output of the second local oscillator 112 in the second mixer 110 to become a low IF signal 140. The low IF signal 140 comprises the television channels passed by the high IF bandpass filter 108 reduced in frequency to approximately 44 megahertz. The second IF bandpass filter 114 removes the undesired television channels from the low IF signal 140 and outputs an IF signal 145. The IF signal 145 comprises the desired television channel and is sent to the variable gain amplifier 116 for amplification, then to the tuner output 117.

Note also the optional baluns 131, 132, 133, 134 for single ended to differential (or differential to single ended) conversion of the signal.

The Printed Bandpass Filter

A high IF bandpass filter 108 is implemented in one embodiment using quarter-wavelength resonators and a parallel delay line printed together on a precision substrate.

Figure 2:
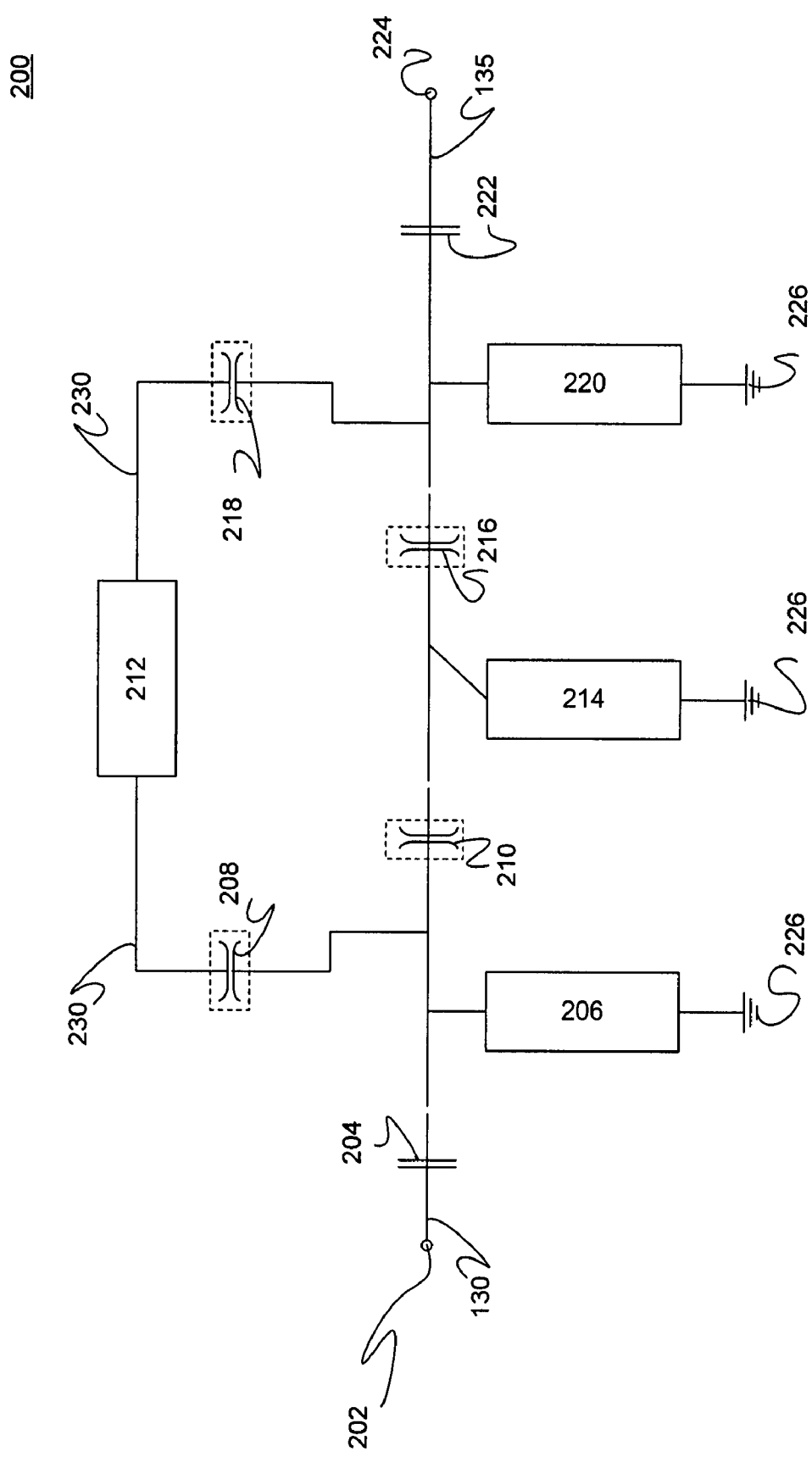
FIG. 2 illustrates a schematic of the bandpass filter according to the present invention.

FIG. 2 illustrates an electrical schematic of a bandpass filter 200. Referring to FIG. 2, the bandpass filter 200 comprises an input capacitor 204 coupled to a filter input 202, a delay input coupler 208, a first resonator 206, and a first intercoupler 210. The first intercoupler 210 is coupled to a second intercoupler 216, and a second resonant element 214. The second intercoupler 216 is coupled to a delay output coupler 218, a third resonator 220, and an output capacitor 222. A delay line 212 is coupled to the delay input coupler 208 and the delay output coupler 218. The output capacitor 222 is coupled to the filter output 224. The first resonator 206, the second resonator 214, and the third resonator 220 are coupled to a ground 226.

By adjusting the center frequency of each resonator and the coupling capacitances, a desired frequency response, which is flat over the desired frequency range, can be obtained. The physical dimensions of the resonators determine the frequency response of the filter. If the printed circuit manufacturing process is well controlled, the physical dimensions of the resonators will not vary and post-fabrication tuning will be necessary.

Rejection of the image channel component in the high IF signal 130 can be increased by increasing the number of resonators in the filter. However, adding additional resonators will increase the insertion loss and physical size of the filter.

High IF signal 130 passes from the filter input 202 through the input capacitor 204, the first intercoupler 210, and the second intercoupler 216. The delay input coupler 208 couples a delayed signal 230 from the high IF signal 130 and feeds the delayed signal 230 forward through the delay line 212 to the delay output coupler 218. The physical characteristics of the delay line 212, the input capacitor 204, the delay input coupler 208, the delay output coupler 218, the first intercoupler 210, the second intercoupler 216, and the output capacitor 222 are selected to cause the delayed signal 230 to be approximately equal in amplitude and opposite in phase to the image channel component of high IF signal 130. The output delay coupler 218 couples the delayed signal 230 with the high IF signal 130, substantially attenuating the image channel component in the high IF signal 130 and sending the high filtered IF signal 135 through output capacitor 222 to filter output 224. This novel feed-forward feature increases image channel rejection by the printed bandpass filter 200 without significantly increasing insertion loss or physical size.

Figure 3A:
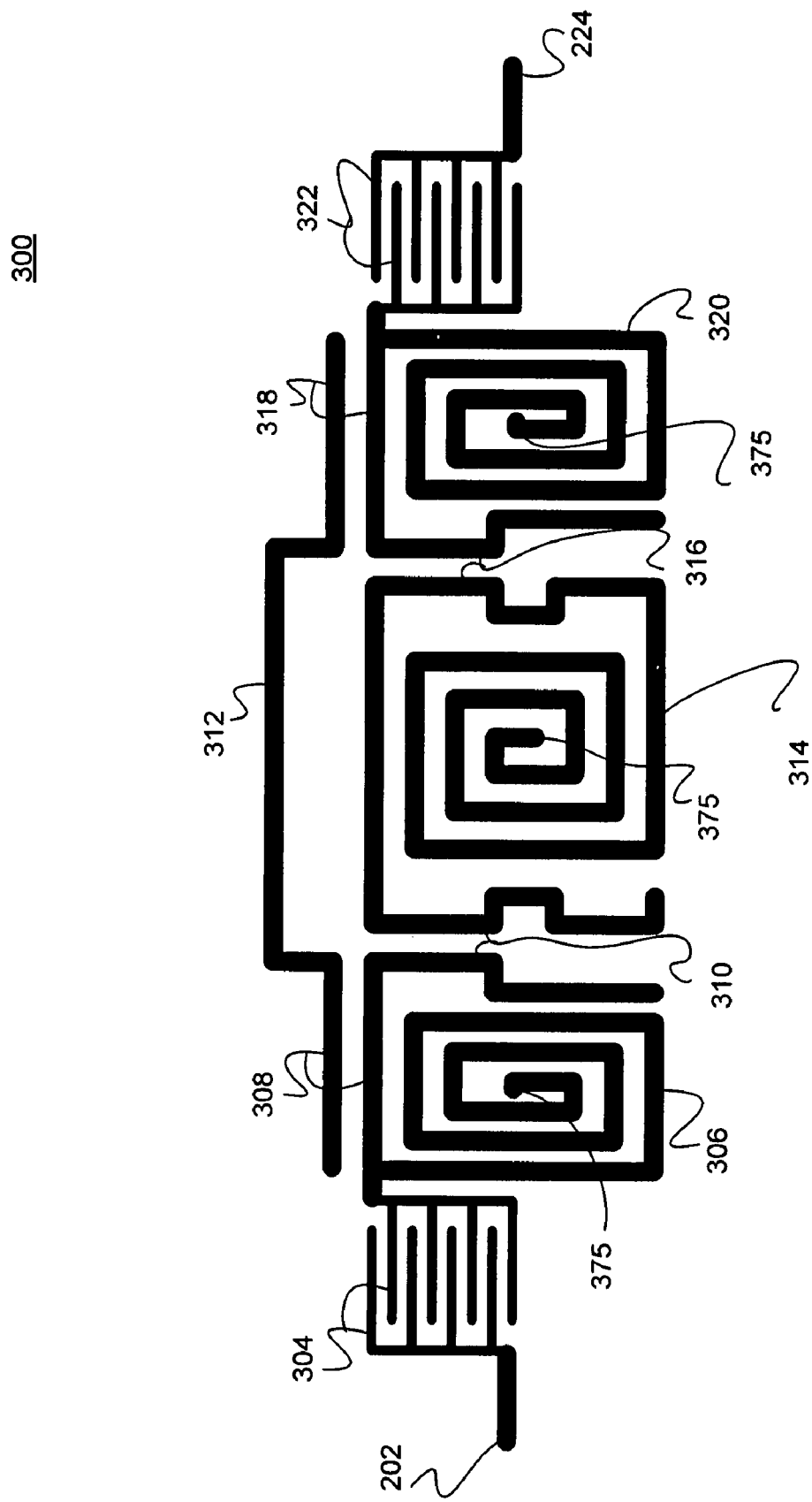
FIG. 3A illustrates a printed circuit embodiment of the bandpass filter.

FIG. 3A illustrates a printed bandpass filter 300, which is a printed version of the bandpass filter 200. Referring to FIG. 3A, the printed bandpass filter 300 comprises an input capacitor 304 coupled to the filter input 202, a delay input coupler 308, a first resonator 306, and a first intercoupler 310. The first intercoupler 310 is coupled to a second intercoupler 316, and a second resonator 314. The second intercoupler 316 is coupled to a delay output coupler 318, a third resonator 320, and an output capacitor 322. A delay line 312 is coupled to the delay input coupler 308 and the delay output coupler 318. The output capacitor 322 is coupled to the filter output 224.

The first resonator 306, the second resonator 314, and the third resonator 320 are coupled to a ground 360 (FIG. 3C) by vias 375a, 375b, and 375c. Each via 375 is a plated-through hole, electrically connecting portions of the printed filter 300 to the ground 360. The input capacitor 304 and the output capacitor 322 are printed finger capacitors. The delay input coupler 308, the delay output coupler 318, the first intercoupler 310, and the second intercoupler 316 are electromagnetically coupled segments of printed transmission line. The delay input coupler 308, the delay output coupler 318, the first intercoupler 310, and the second inter-coupler 316 form a distributed implementation of the weak capacitive couplings used in a lumped-element LC bandpass filter.

The delay line 312 is a printed transmission line. The first resonator 306, the second resonator 314, and the third resonator 320 are shorted quarter-wavelength printed transmission lines. They present an open-circuit at a resonant frequency, and together with the weak capacitive couplings are equivalent to a parallel LC tank circuit at the resonant frequency. To reduce the physical size of printed bandpass filter 300, the quarter-wavelength resonators are printed in the form of spirals on the substrate.

Coupling effects between segments of the spirals are minimized through adequate spacing, and residual effects are modeled with finite-element electromagnetic simulation software, such as IE3D (Zeland Software), SONNET (SONNET Software), Microwave Office (Applied Wave Research) and Ensemble and HFSS (ANSOFT Corp., Pittsburgh, Pa.).

The physical arrangement of transmission lines in relation to each other and to electrical ground, determines whether the transmission line is classified as a coplanar waveguide or as a microstrip transmission line. Either type of transmission line can be used in the present invention to achieve the performance benefits discussed above.

Impedance and electrical length determine the properties of a quarter-wavelength resonator. Using a substrate material with well-controlled electrical and mechanical properties, i.e., dielectric constant, thickness, and dimensional stability, allows the circuit designer to control the filter's electrical characteristics very tightly. In a preferred embodiment, the substrate material chosen was GML-1000 (GIL Technologies, Collierville, Tenn.) and the printed bandpass filter 300 input and output impedance are 200 ohms. Persons of skill in the art will recognize other substrate materials that can be substituted to provide equivalent mechanical and electrical properties, of primary importance being low variation in the dielectric constant (e.g., less than 2% variation in $\in_r$) and ability to maintain precise substrate thickness. In some cases, air may be used as a "substrate".

Controlling the substrate's electrical and mechanical properties makes the filter less susceptible to variations in the manufacturing process. It helps ensure repeatable behavior in the intercoupler sections, the delay input coupler and delay line output coupler sections, and in the delay line itself. Repeatability means the variations in electrical characteristics found in a lumped element bandpass filter are not present in the printed bandpass filter. As a result, there is no need to tune the present invention after fabrication.

Resonator to resonator coupling is accomplished by placing short segments of the resonators in close proximity to each other. This technique is also used to couple the delay line 312 to the printed filter 300 using delay input coupler 308 and delay output coupler 318. Coupling the filter input 202 and the filter output 224 to the printed filter 300 requires stronger coupling than can be achieved with transmission lines. Therefore, finger capacitors are used for the input capacitor 304 and the output capacitor 322. The electrical properties of these capacitors are also well controlled if the substrate electrical and mechanical properties are well controlled.

Figure 3B:
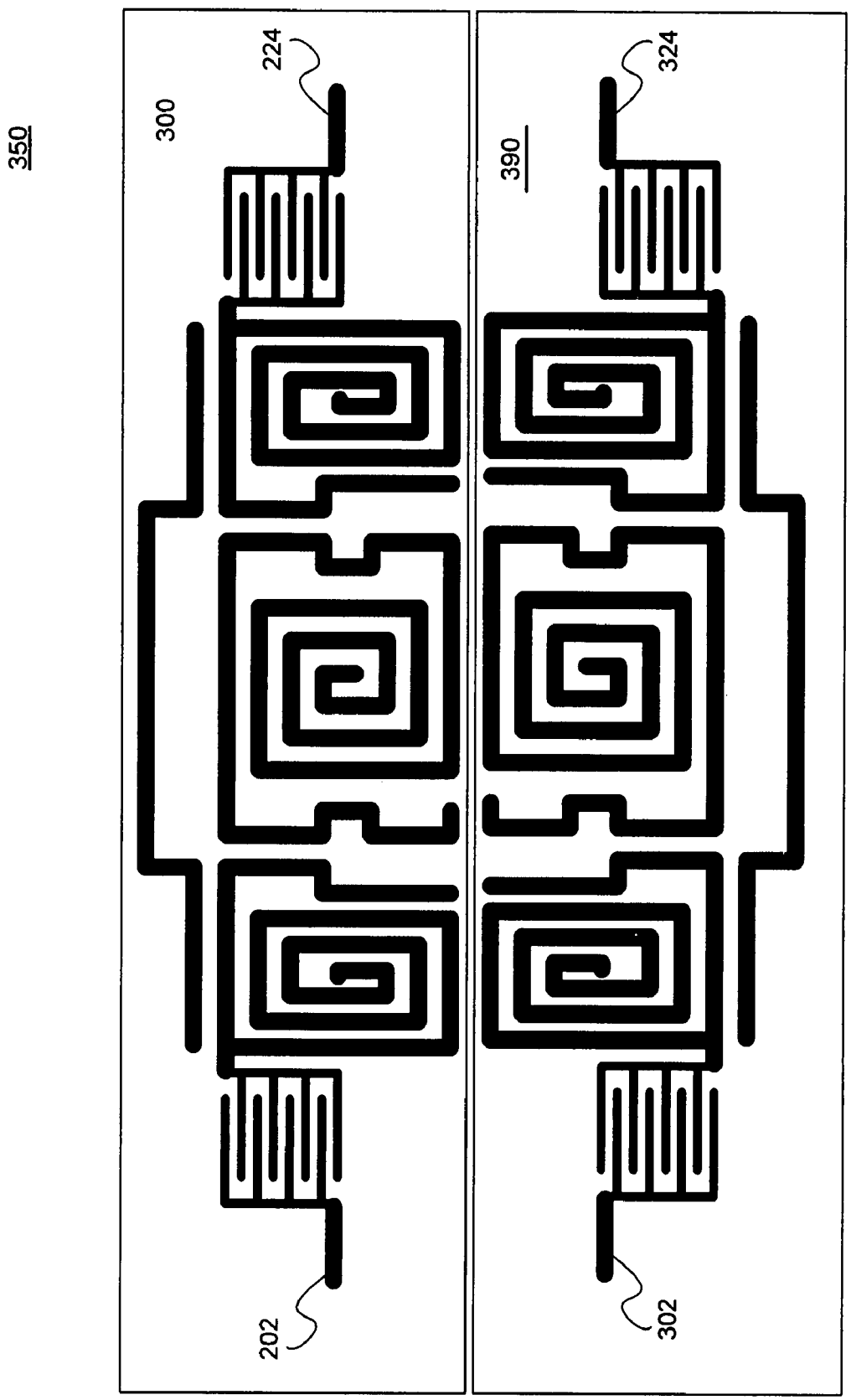
FIG. 3B illustrates a printed bandpass filter for use in differential signal applications.

FIG. 3B illustrates a differential printed bandpass filter 350. The differential printed bandpass filter 350 comprises the printed bandpass filter 300 and a second printed bandpass filter 390. The second printed bandpass filter 390 comprises the mirror image of the printed bandpass filter 300, a second filter input 302 and a second filter output 324. The printed bandpass filter 300 and the second printed bandpass filter 390 are printed on the same substrate in a manner to allow a differential signal to be applied to the filter input 202 and the second filter input 302. The filtered differential signal is output at the filter output 224 and the second filter output 324. The printed bandpass filter 300 and the second printed bandpass filter 390 perform the same filtering function described above, on a differential signal. The differential printed bandpass filter 350 enables a balanced signal to be used in tuner 100. A balanced signal exhibits higher dynamic range and lower pick-up and generation of interference noise than an unbalanced signal.

Figure 3C:
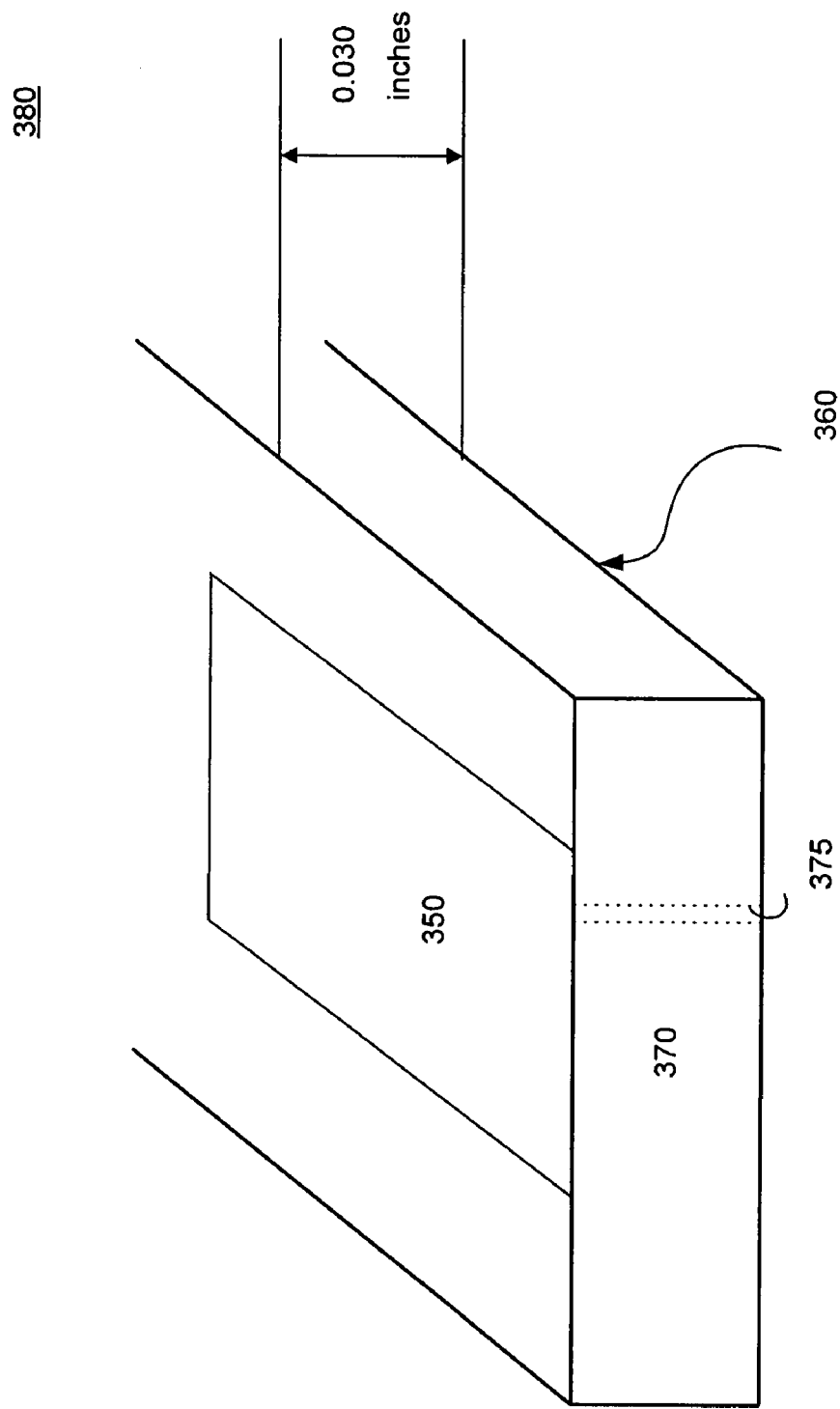
FIG. 3C illustrates details of a bandpass filter printed on a precision substrate.

FIG. 3C illustrates a three-dimensional view of a printed filter assembly 380. Referring to FIG. 3C, the filter assembly 380 comprises a precision substrate 370, the differential printed bandpass filter 350 and a ground 360. The ground 360 is a metal pattern placed on the precision substrate 370 opposite the side the differential printed bandpass filter 350 is placed. A preferred method of coupling the ground 360 to the differential printed bandpass filter 350 is by the via 375. Referring to FIG. 3A, the first resonator 306, the second resonator 314 and the third resonator 320 are coupled to the ground 360 by vias 375a, 375b, and 375c respectively. The via 375 may also be used to bring input and output signals from the differential printed bandpass filter 350 through the precision substrate 370 for coupling with components of the tuner 100.

The proximity of the differential printed bandpass filter 350 and the ground 360 can cause a waveguide-like effect in precision substrate 370. This effect results in some portion of high IF signal 130 bypassing the differential printed bandpass filter 350 and increasing the out of band signal at filter output 224. This effect is undesirable.

A plurality of vias 375 can be coupled between the ground and a blocking strip (not shown). The vias 375, the blocking strip, and the ground 360 remove any high IF signal 130 leaking into the precision substrate 370 by shunting the signal to ground before it is seen at the filter output 224.

Figure 4A:
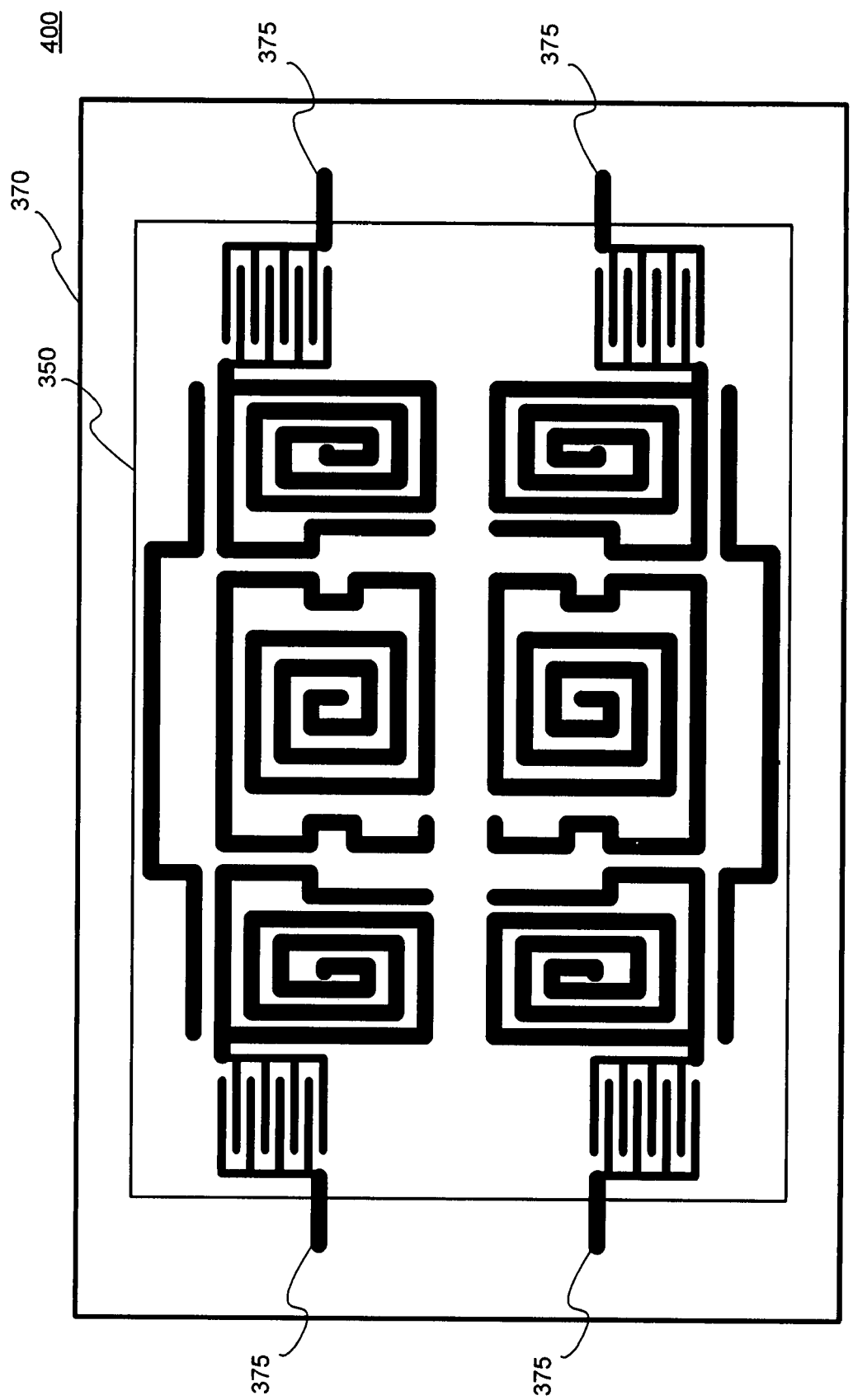
FIG. 4A illustrates the connections for attaching the printed filter assembly to a second printed circuit board.
Figure 4B:
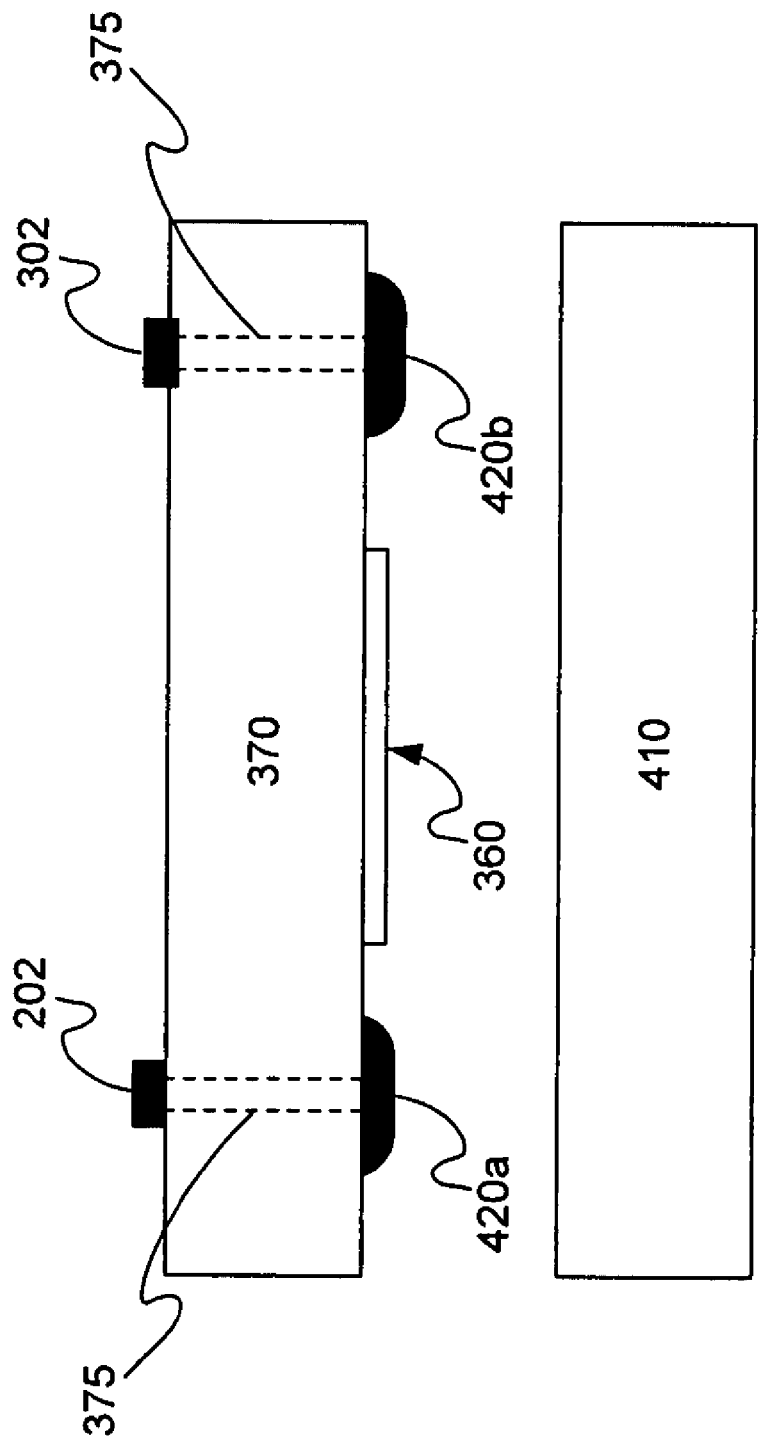
FIG. 4B illustrates details of connecting the printed filter assembly to a second printed circuit board.

FIG. 4A illustrates the differential printed bandpass filter 350 connections used when printed filter assembly 380 is mounted on a second printed circuit board 410 (FIG. 4B). The second printed circuit board 410 incorporates elements of the tuner 100, and possibly other circuits, which are part of a larger assembly, including the tuner 100. Referring to FIG. 4A, the filter input 202, the filter second input 302, the filter output 224 and the second filter output 324 are connected to vias 375a, 375b, 375c, and 375d respectively.

FIG. 4B illustrates a land pattern 420 used to connect the differential printed bandpass filter 350 to the second printed circuit board 410. Coupling the printed filter assembly 380 to the second printed circuit board 410 eliminates the need to use relatively expensive precision substrate 370 for the second printed circuit board 410.

Referring to FIG. 4B, the via 375a is coupled between the filter input 202 and the land pattern 420a. When the printed circuit assembly 380 is landed on the second printed circuit board 410, the land pattern 420a couples the positive side of high IF signal 130 from the second printed circuit board 410 to the filter input 202. The via 375b is coupled between the second filter input 302 and the land pattern 420b. When landed, the land pattern 420b couples the negative side of high IF signal 130 from the second printed circuit board 410 to the second filter input 302. In a similar manner the via 375c is coupled between the filter output 224 and land pattern 420c, and the via 375d is coupled between the second filter output 324 and land pattern 420d. Additional vias 375 and land pattern 420 are used as necessary to route additional connections between the printed filter assembly 380 and the second printed circuit board 410.

The land pattern 420 and the ground 360 coexist on the same side of the precision substrate 370. The land pattern 420 and the ground 360 are separated where necessary to couple a signal carrying element from the differential printed bandpass filter 350 to the land pattern 420. The land pattern 420 and the ground 360 are coupled where necessary to connect the ground 360 to the second printed circuit board 410.

The precision substrate 370 has a slightly larger coefficient of thermal expansion than the industry-standard printed circuit board material (FR-4). The difference in thermal expansion coefficient causes repetitive thermal stresses to be applied to the solder connections between the printed filter assembly 380 and the second printed circuit board 410.

Figure 5:
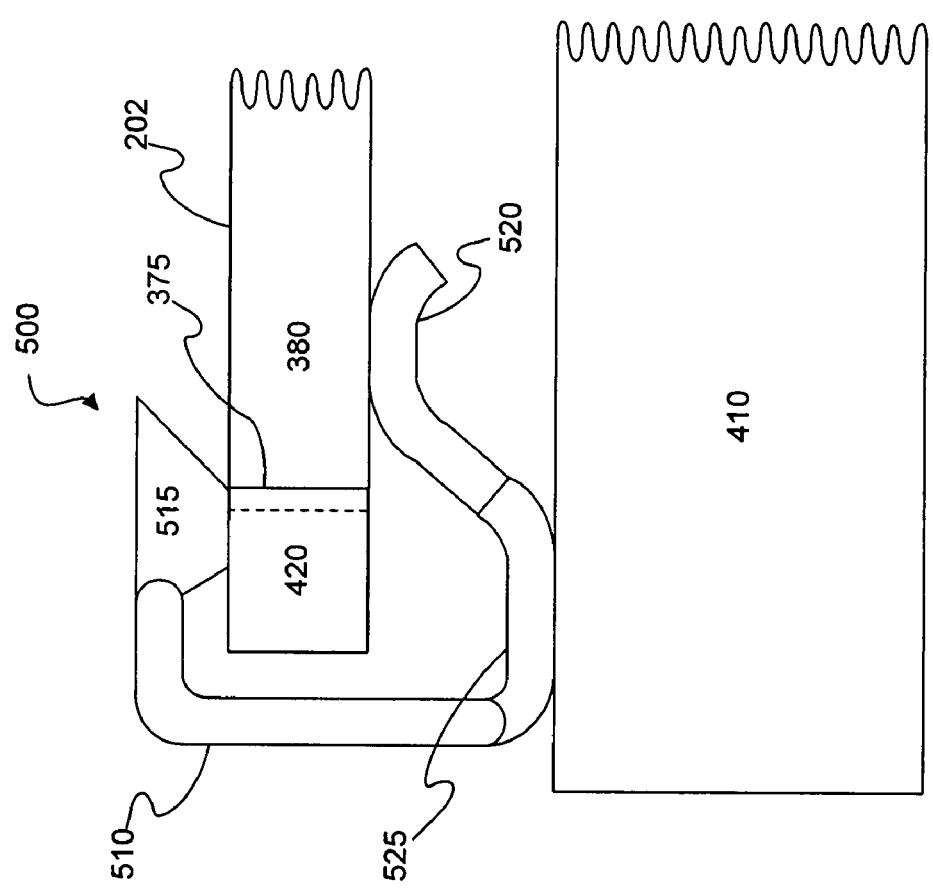
FIG. 5 illustrates the apparatus used to mount a printed bandpass filter assembly to another printed circuit board.

FIG. 5 illustrates an apparatus 500 for mitigating thermal cycling stress while maintaining the necessary electrical coupling between the differential printed bandpass filter 350 and the second printed circuit board 410. The apparatus 500 comprises a cup 515 coupled to a riser 510, to a base 525, and to a lower element 520. One example of the apparatus 500 is surface mount pin (model 34AC) by NAS Interplex, Flushing, N.Y.

In this example, the apparatus is connected to the filter input 202. Additional apparatus 500 can be connected, as described below, to provide thermal stress relief for any connection between the printed filter assembly 380 and the second printed circuit board 410. These connections comprise the second filter input 302, the filter output 224, the second filter output 324, and ground 360.

The cup 515 is connected to the filter input 202 and the lower element 520 is connected to the land pattern 420. The cup 515 is also coupled to via 375 which is coupled to land pattern 420. The apparatus 500 and the via 375 ensure a good electrical connection is maintained between the filter input 202 and the second printed circuit board 410. Any differential thermal expansion is absorbed by deflection of the riser 510 vice deflection of an affected solder connection.

Designing the Printed Bandpass Filter

The detailed design of the filter is accomplished using numerical optimization techniques. First, the structure of the filter is described in terms of coupled microstrip lines and input and output coupling capacitances using the RF circuit simulator MMICAD (Optotek Ltd., Kanata, Ontario, Canada). Lengths of the resonator and coupling sections, spacing of the coupled sections, input and output coupling capacitors, and length of the delay line are variables to be optimized (although approximate initial values were specified as a starting point). When an acceptable design was obtained using MMICAD, the filter's physical parameters were refined using electromagnetic finite-element simulation, as described above.

Figure 6:
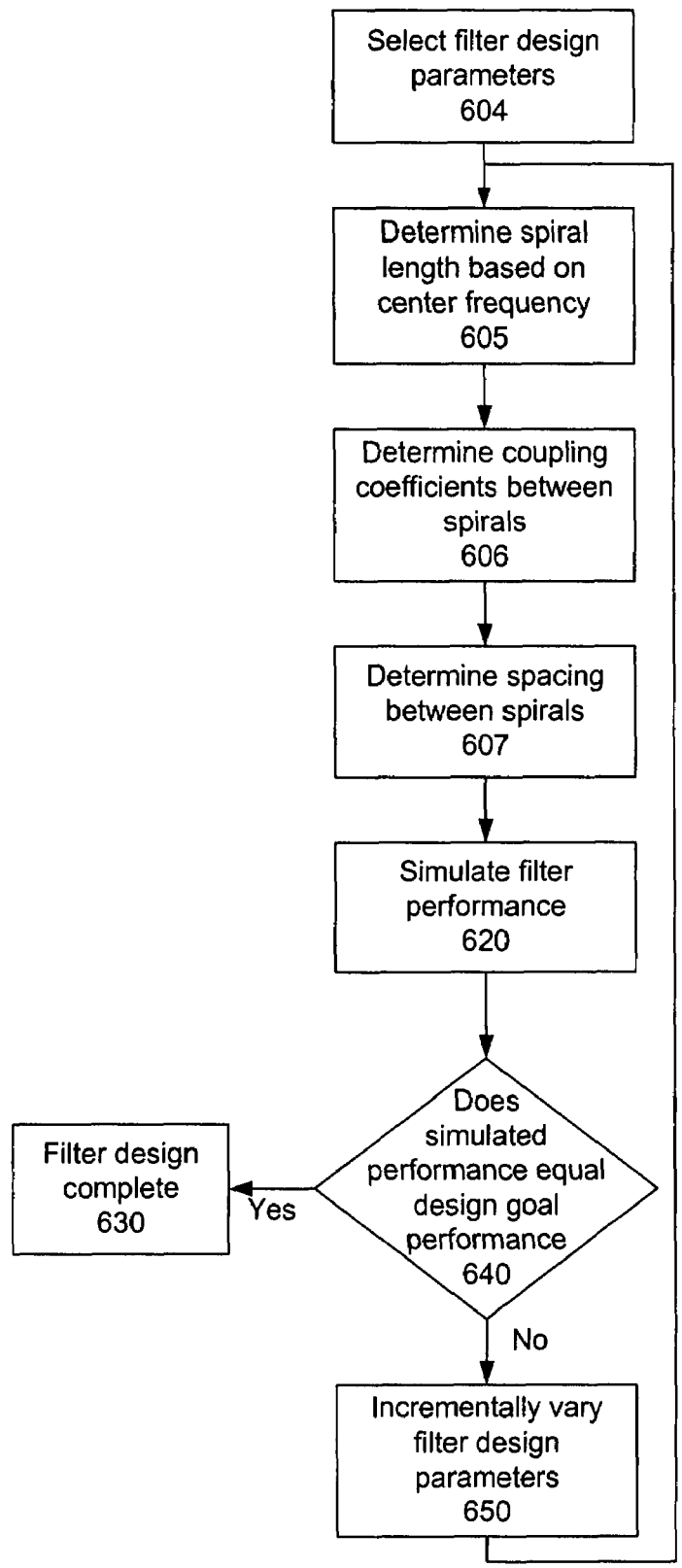
FIG. 6 is a flow chart illustrating the steps used in designing a printed bandpass filter.

FIG. 6 illustrates the steps of a method for printed bandpass filter design 600. In step 604, the variable filter design parameters (e.g. bandwidth, center frequency) used in the design are selected. In step 605, the spiral length is determined based on the frequency of interest. In step 606, coupling coefficients between the spirals are determined based on the filter design parameters. In step 607, spacing between spirals is determined based on the coupling coefficient. In step 620, printed bandpass filter performance is simulated. In step 640, if simulated printed bandpass filter performance is equal to the filter design goal performance, step 630 is performed. If printed bandpass filter simulated performance is less than filter design goal performance, step 650 is performed. In step 630, the filter design is complete. In step 650, the filter design parameters are incrementally varied in a manner to cause the simulated printed filter performance to approach the design goal performance. Steps 605, 606, 607, 620, 640, and 650 are repeated until the simulated filter performance is equal to the design goal performance.

A C-Shaped Filter Embodiment

Figure 7:
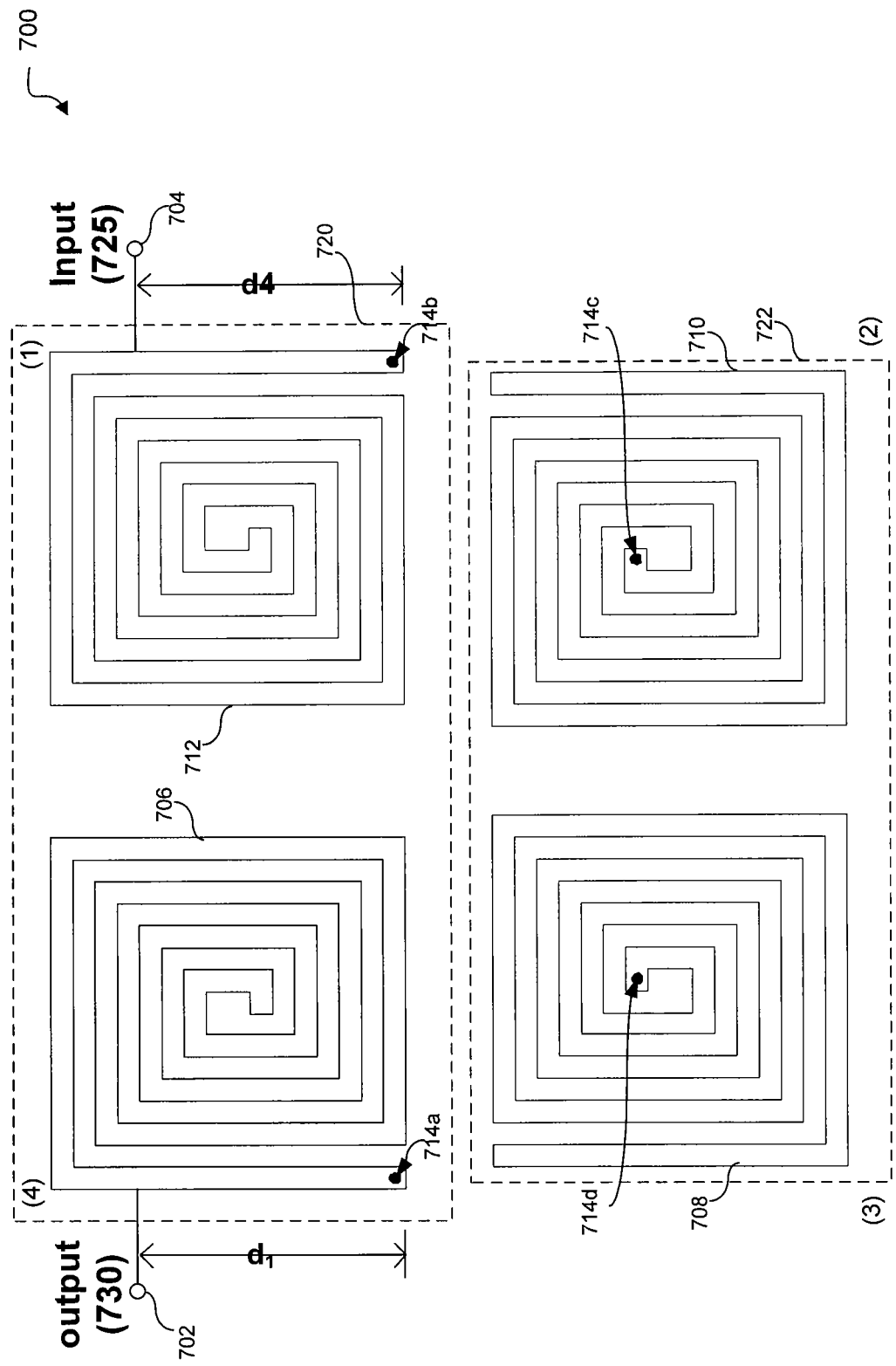
FIG. 7 illustrates a C-shaped embodiment of the printed bandpass filter.

FIG. 7 illustrates an embodiment of a C-shaped printed filter 700. The C-shaped printed filter 700 comprises a signal input 704 (for input signal 725) and a signal output 702 (for output signal 730). The printed filter 700 includes a fourth printed element 706 (resonator), a second printed element 710, a third printed element 708, and a first printed element 712. The signal input 704 is coupled to the first printed element 712, and the signal output 702 is coupled to the fourth printed element 706.

The fourth printed element 706 is comprised of a printed strip laid down in a square clockwise spiral pattern. A ground 714a is coupled to the fourth printed element 706 at the end of the printed strip ending outside the printed spiral pattern.

Figure 9:
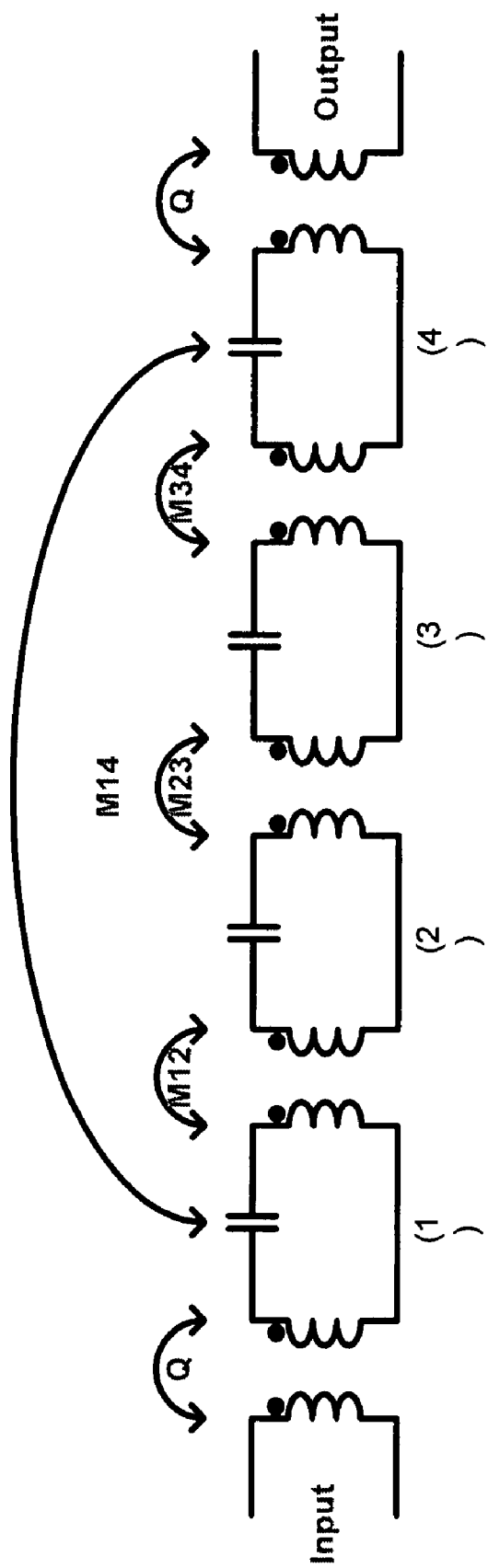
FIG. 9 shows an equivalent circuit diagram of the four resonators of FIG. 8.

The fourth printed element 706 is electromagnetically coupled to the first printed element 712 with a coupling coefficient M14 (see FIG. 9). The first printed element 712 is comprised of a printed strip laid down in a square counterclockwise spiral pattern. A ground 714b is coupled to the first printed element 712 at the end of the printed strip ending outside the printed spiral pattern. The first printed element 712 is also electromagnetically coupled to the second printed element 710 with a coupling coefficient M12 (see FIG. 9).

The second printed element 710 is comprised of a printed strip laid down in a square clockwise spiral pattern. A ground 714c is coupled to the second printed element 710 at the end of the printed strip ending inside the printed square spiral. The second printed element 710 is electromagnetically coupled to the third printed element 708 with a coupling coefficient M23 (see FIG. 9).

The third printed element 708 is comprised of a printed metal strip laid down in a square counterclockwise spiral pattern. A ground 714d is coupled to the third printed element 708 at the end of the printed strip ending inside the square spiral pattern. The third printed element 708 is also electromagnetically coupled to the fourth printed element 706 with a coupling coefficient M34 (see FIG. 9).

The inductive, capacitive and resistive characteristics of each printed element is determined by the width of the printed strip comprising the printed element, the spacing between the printed strip in each printed spiral, where the printed strip is coupled to ground, and the spacing between adjacent printed elements.

Still referring to FIG. 7, the fourth printed element 706 and the first printed element 712 form a first resonant element 720. The third printed element 708 and the second printed element 710 form a second resonant element 722, which is out of phase with the first resonant element 720. The pass-band of the first resonant element 720 is determined by the spacing between the fourth printed element 706 and the first printed element 712. The pass-band of the second resonant element 722 is determined by the spacing between the third printed element 708 and the second printed element 710. The pass-band characteristics of the C-shaped printed filter 700 are determined by the spacing between the first resonant element 720 and the second resonant element 722.

A first signal path is formed by elements 712, 710, 708, and 706. A second signal path is formed from 712 directly to 706. By adjusting the spacing between the fourth printed element 706 and the third printed element 708, as well as the spacing between the first printed element 712, the second printed element 710, and the third printed element 708, the first signal path 712-710-708-706 in the bandpass of interest is coupled out of phase with the second signal path 712-706. The coupling between the fourth printed element 706 and the third printed element 708 is adjusted to couple a portion of the image channel in the signal path 706-712 out of phase with the image channel in the signal path 712-710-708-706. The out of phase signal coupling at essentially equal magnitudes at the bandpass frequency of interest reduces or eliminates the image channel signal in the output signal 730.

Although the filter 700 described in this embodiment is a single-ended filter, baluns may be used to convert to a differential signal, as shown in FIG. 1.

Figure 8:
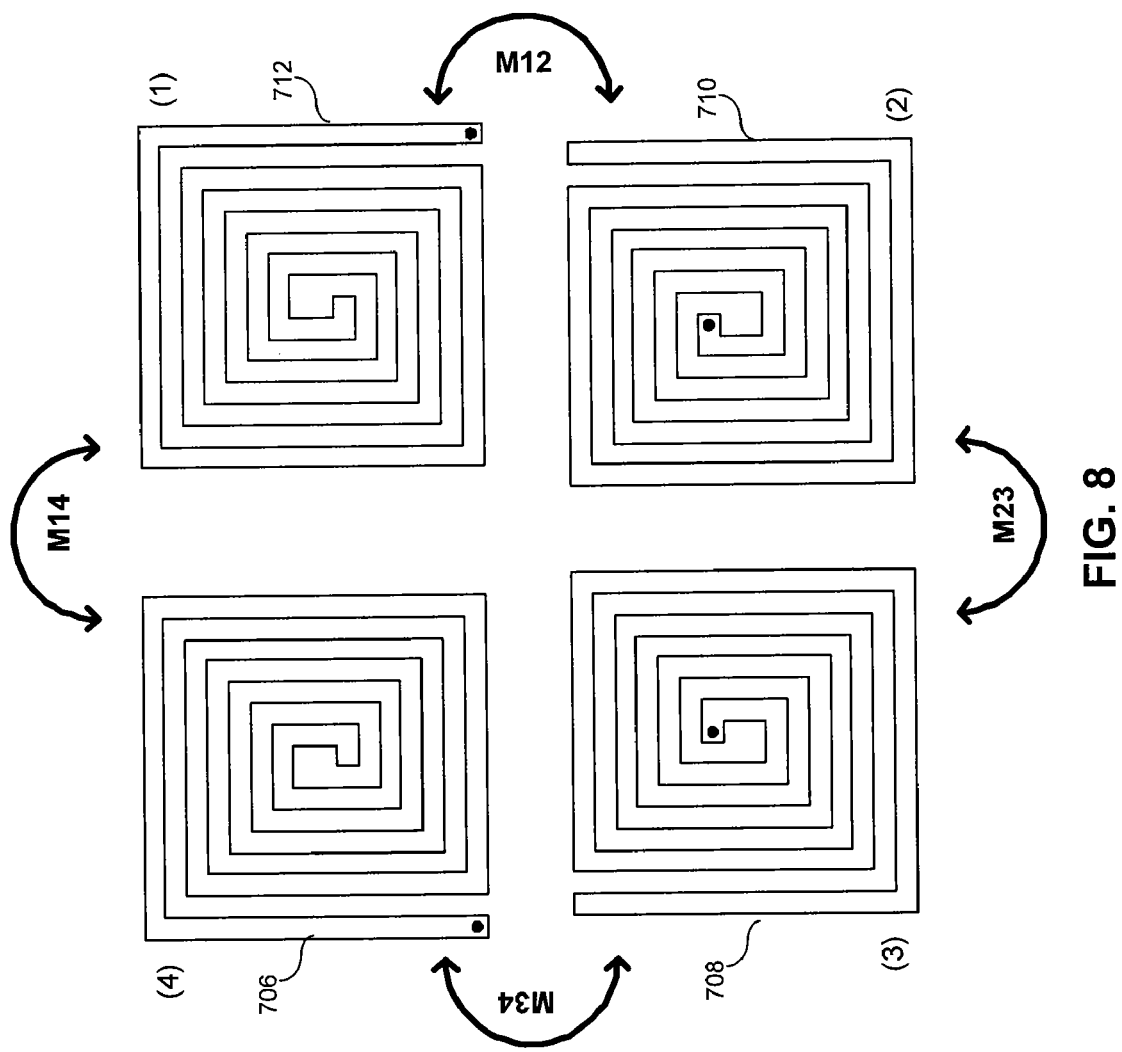
FIG. 8 illustrates the arrangement of four resonators for purposes of coupling calculations.

FIG. 8 illustrates an example of a four-resonator filter for purposes of illustrating coupling coefficients between the printed elements that are quarter-wavelength in length. The printed elements 706, 708, 710 and 712 have the coupling coefficients of M14, M12, M23, and M34 as shown in the figure. Depending on the location of a via (i.e., location of connection to the ground) of each resonator, the coupling coefficient M between the four printed elements is electric, magnetic, or mixed electric/magnetic. In the case of magnetic coupling, the coupling coefficient M is negative (relative to the electric coupling coefficient), and corresponds to out-of-phase coupling. In the case of electric coupling, the coupling coefficient M is positive, and corresponds to in-phase coupling. In the case of mixed coupling, the coupling coefficient M may be either positive or negative.

FIG. 9 shows an equivalent circuit diagram for the four-pole cross couple bandpass filter, particularly illustrating the coupling coefficients M between the poles, i.e., between the resonators 706, 708, 710, 712. As shown in FIG. 9, the filter includes sequential coupling M12, M23 and M34, and direct coupling M14 between the first resonator 706 and the fourth resonator 712. Thus, the overall filter 700 uses a linear combination of the two paths represented by the coupling coefficient M14 for the second path, and the coupling coefficients M12-M23-M34 for the first path. The path with the coupling coefficient M14 is out of phase with the path represented by the coefficients M12-M23-M34.

Figure 10:
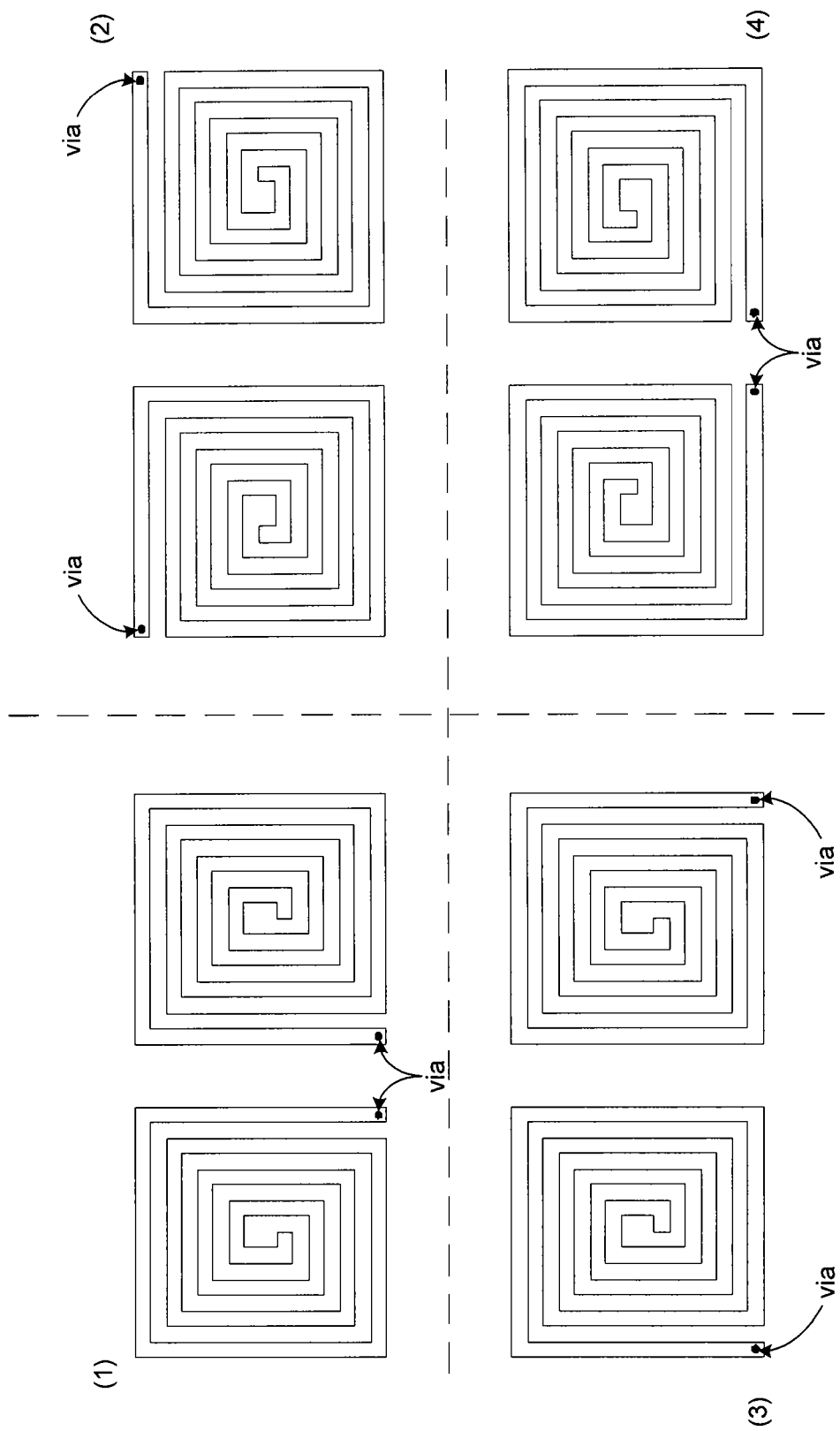
FIG. 10 shows four different arrangements of two resonators that use magnetic coupling.

FIG. 10 illustrates different ways of combining two resonators to effect magnetic coupling between them. As shown in FIG. 10, each resonator has a ground at the via, which is located at the outer end of the stripe that forms a square spiral. The minimum current is at the center of the spiral, and the voltage at the center of the spiral is maximum. Correspondingly, the maximum current is at the via (ground), and the minimum voltage is also at the via. Thus, the strongest coupling of the four arrangements shown in FIG. 10 is for the upper left arrangement (1) because the via with maximum currents are adjacent to one another. The next strongest magnetic coupling is for the arrangement (2) in upper right hand corner, the next weakest magnetic coupling is for the arrangement (3) in the lower left corner, and the weakest magnetic coupling is for the arrangement (4) in the lower right hand corner. Essentially, the greater the distance between the closest legs of the spiral that provide the coupling, and the ground, the weaker the magnetic coupling.

Figure 11:
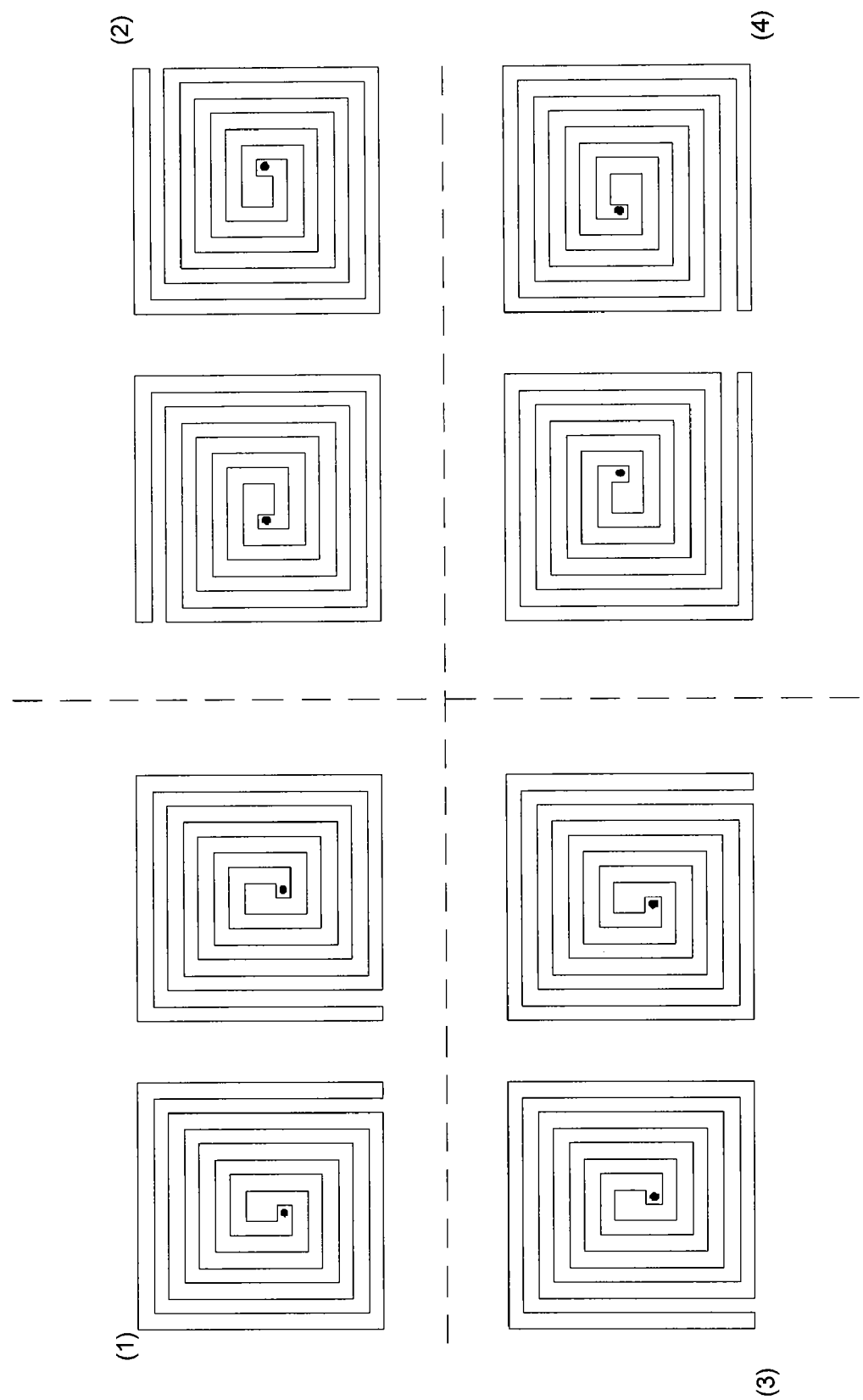
FIG. 11 shows four different arrangements of two resonators that use electrical coupling.

FIG. 11 illustrates four different ways that resonators may be coupled electrically. The via (ground connection) is in the center of the spirals shown in FIG. 11. As with the magnetic coupling of FIG. 10, the electric coupling between the resonators of FIG. 11 is strongest in arrangement (1), and progressively weaker in arrangements (2), (3) and (4). Note that in the case of electrical coupling, the voltage is maximum at the outer end and minimum at the center of the spiral, where the via is. The current is minimum at the outer end of the spiral, and maximum at the center of the spiral. Note further that in an actual filter it is not always necessary to utilize the strongest coupling, since other considerations, such as distance between the resonators, materials utilized, and other engineering and design considerations, may dictate another choice. In one embodiment discussed with reference to FIG. 7, arrangement (3) was chosen for both electric coupling and magnetic coupling.

Figure 12:
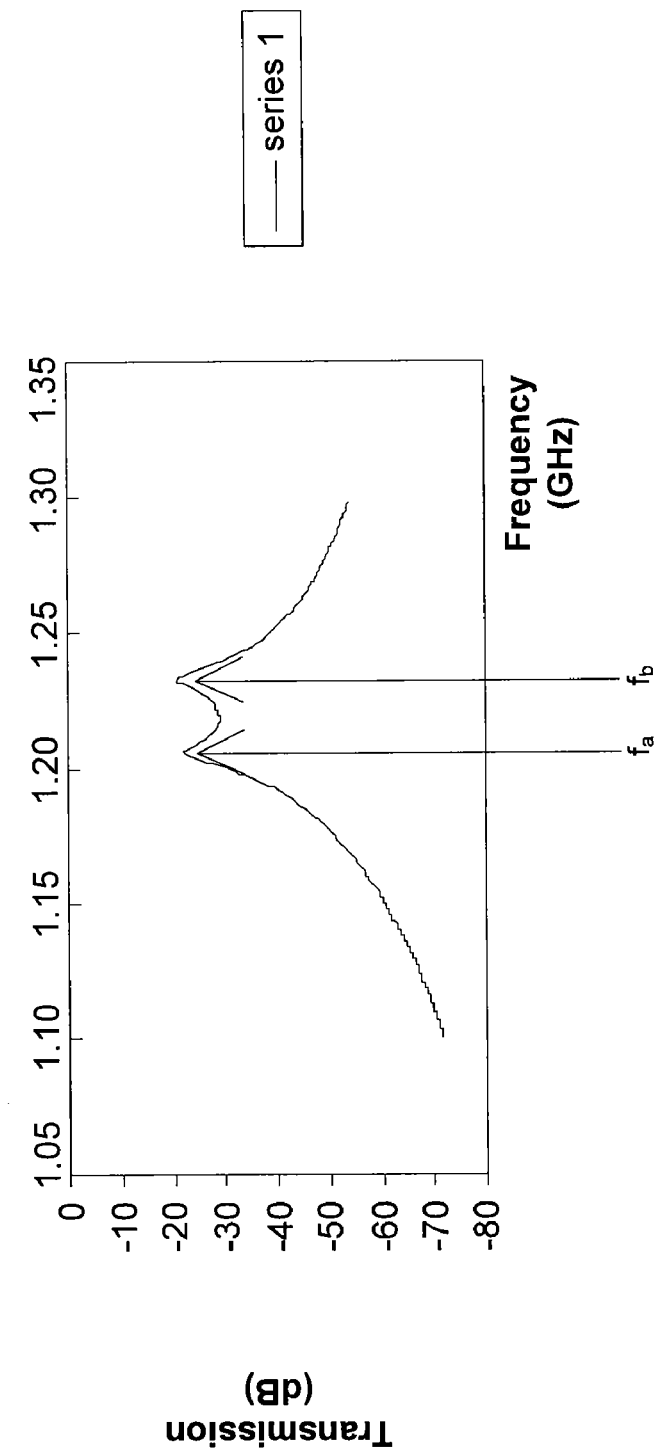
FIG. 12 illustrates a resonant mode splitting of two resonators.

FIG. 12 illustrates a graph of transmission of two coupled resonators of the resonator structure of FIG. 7. Note particularly the two frequency notches, designated as $f_a$ and $f_b$. The coupling coefficients $M_{ij}$ for two coupled resonators i and j can be calculated as follows:

$$M_{ij} = \pm \frac{f_b^2 - f_a^2}{f_b^2 + f_a^2}$$

(The order of the subscripts of M is arbitrary.) Generally, a four-pole elliptic function bandpass microstrip filter has a center frequency $f_o$ and the fractional bandwidth $\delta = \Delta f/f_o$. The coupling matrix [M] for input/output singly loaded Q=1/R can be found in Hong and Lancaster, *IEEE Trans. Microwave Theory Tech.*, 45:1226-1231 (1997), and the cross couplings can be synthesized using the method described in Atia and Williams, *IEEE Trans. Microwave Theory Tech.*, 20:258-265 (1972), which are incorporated by reference herein. The lumped circuit element values of the lowpass prototype filter are $g_0$, $g_1$, $g_2$, $J_1$ and $J_2$, as discussed in Hong et al. and Atia et al. above. The design parameters for the filter can be calculated as $$M_{12} = M_{34} = \frac{\delta}{\sqrt{g_1 g_2}}$$

$$M_{14} = \frac{\delta J_1}{g_1}$$

$$M_{23} = \frac{\delta J_2}{g_2}$$

$$Q = \frac{g_0 g_1}{\delta}$$

In one embodiment of the filter 700 discussed above, the coefficients calculated are:

M34=0.0261

M23=0.022

M12=0.0261

M14=−0.0058 and Q=28.56.

Note that the negative sign for the M14 coefficient denotes only that it is out of phase with the other coefficients (e.g., M23). Note also that due to the presence of the vias, the spiral resonators have a length of 8/4 (and would be 8/2 without a via).

Figure 13:
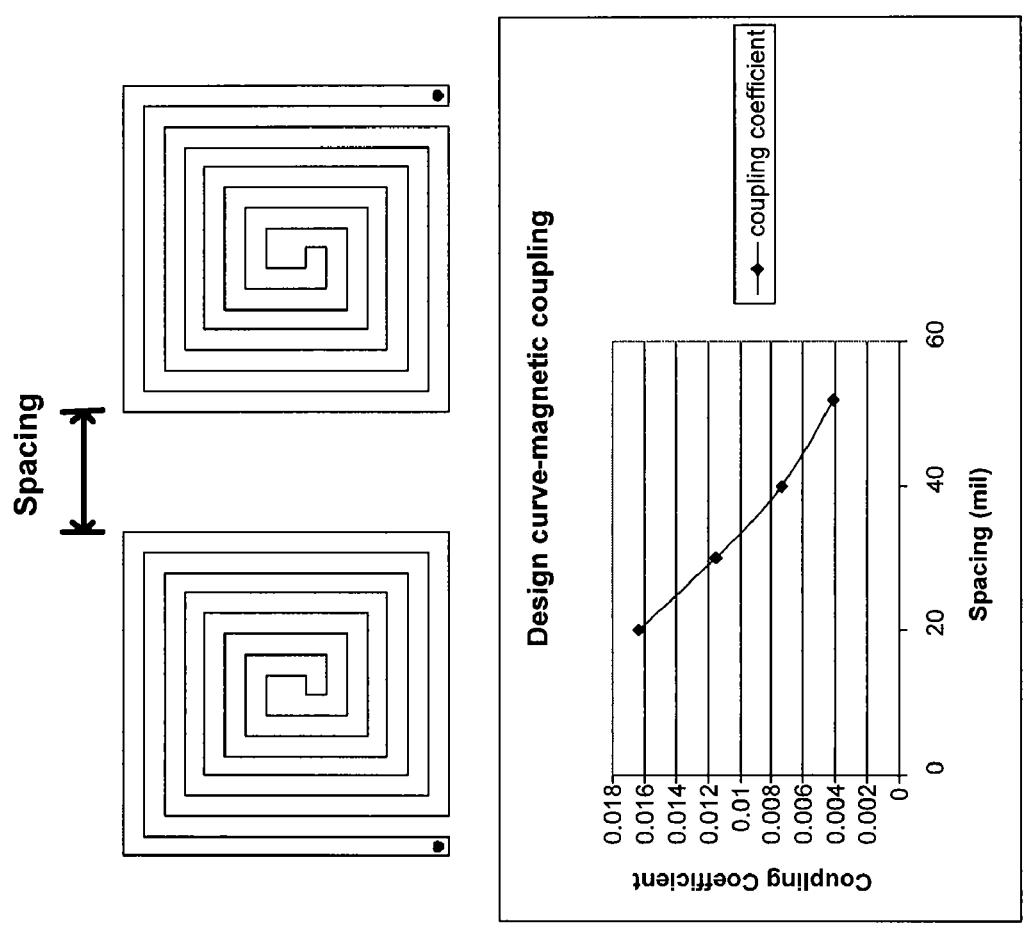
FIGS. 13-15 illustrate a dependence of the relationship between the coupling coefficient of two resonators and the spacing between the resonators.
Figure 14:
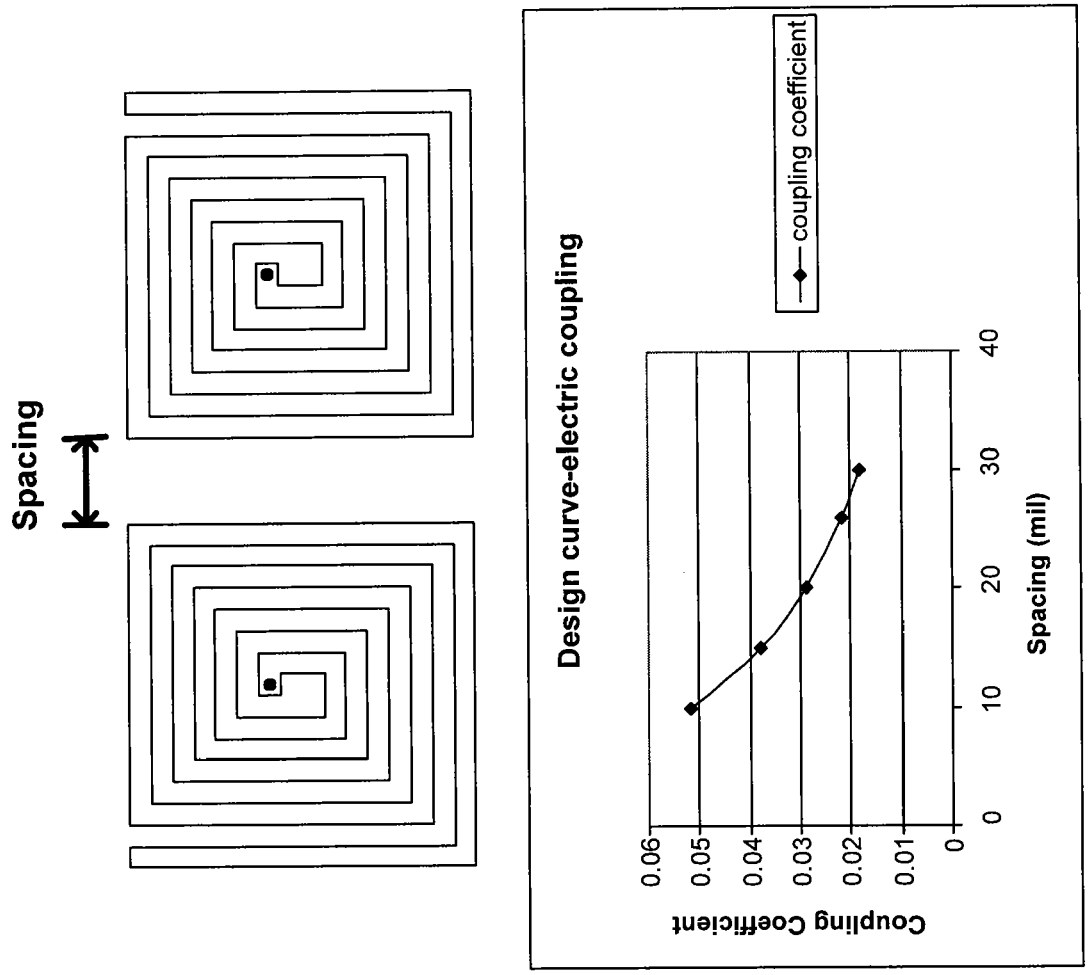
Figure 15:
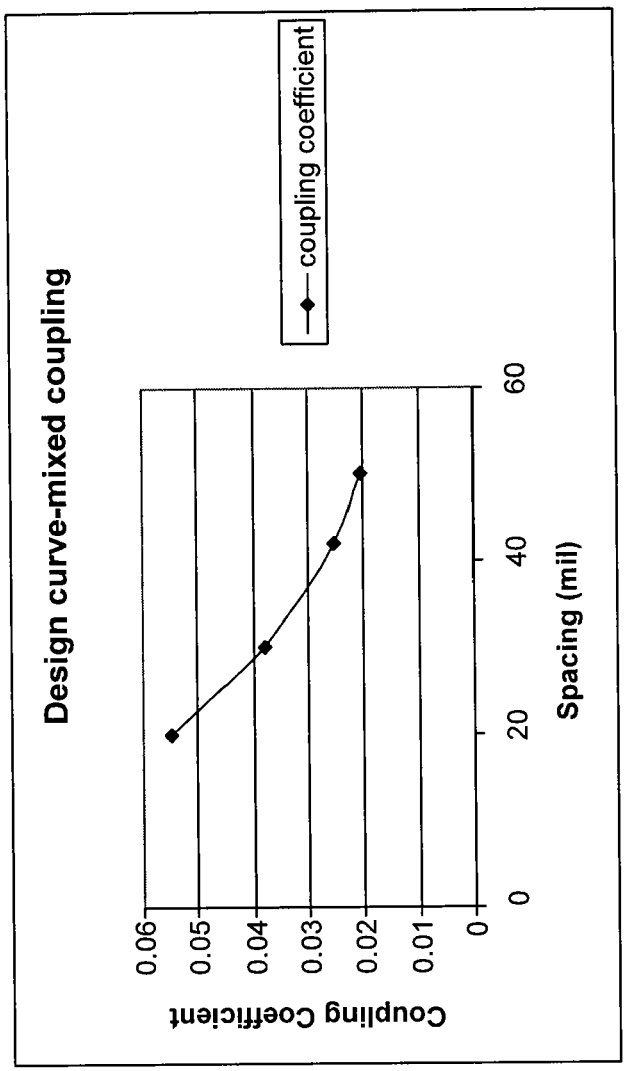
Figure 15:
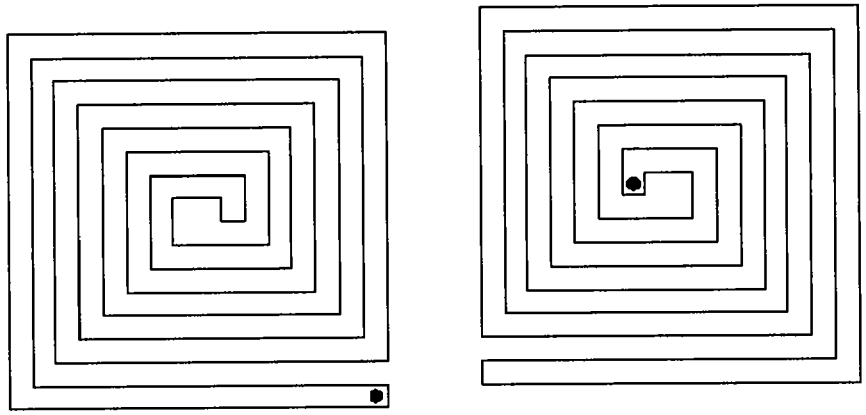

FIGS. 13 through 15 illustrate the dependence of the coupling coefficient M on the spacing between the two resonators that are being coupled. Specifically, FIG. 13 shows the coupling coefficient M as a function of spacing in the case of magnetic coupling between two resonators, FIG. 14 illustrates the coupling coefficient M as a function of spacing in the case of electric coupling between two resonators, and FIG. 15 shows dependence of the coupling coefficient M in the case of mixed coupling between two resonators. As may be seen from these figures, the dependence is essentially inverse with spacing. Note that in the particular embodiment discussed herein, the preferred substrate is GML-1000 Duroid, 32 mil thickness, dielectric constant 3.2∈.

Figure 16:
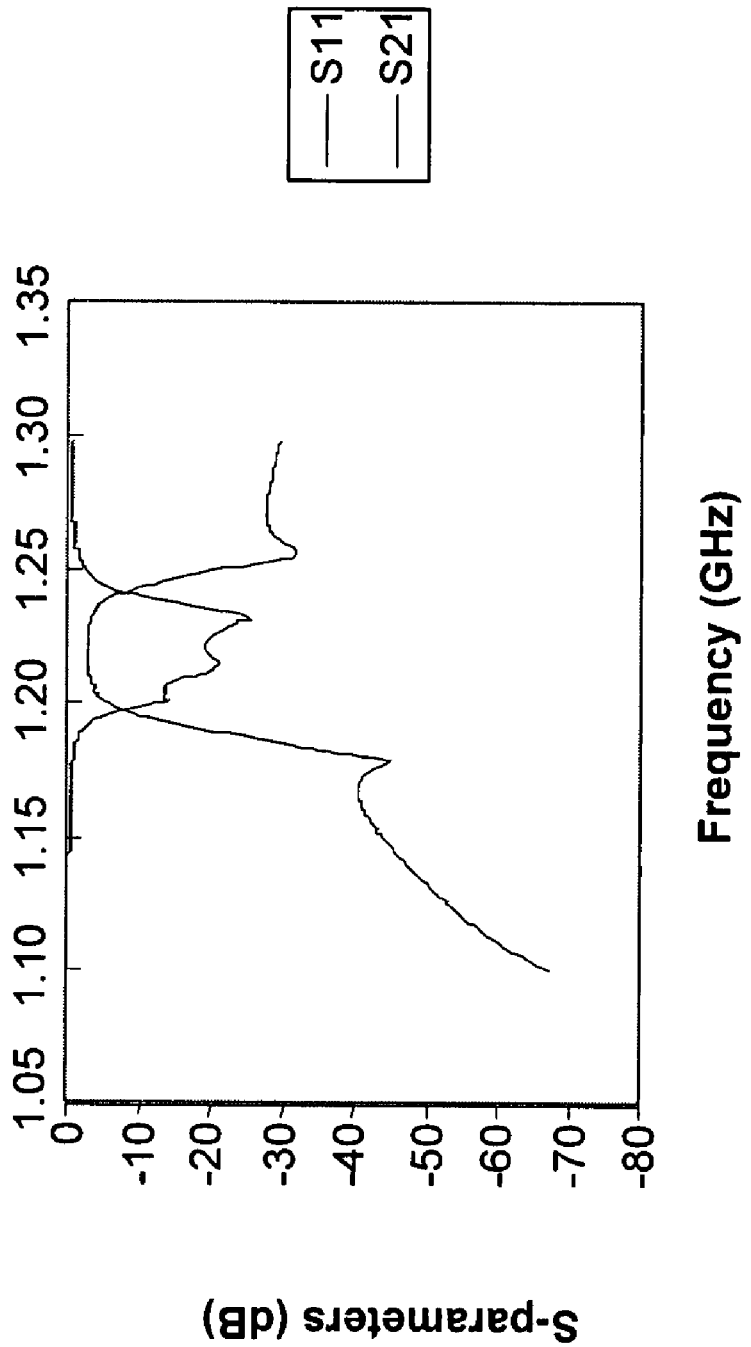
FIG. 16 shows a graph of simulated S-parameters of one embodiment of a filter of the present invention.

FIG. 16 illustrates simulated S parameters (i.e., the transmission, or coupling) of the filter embodiment shown in FIG. 7.

Figure 17:
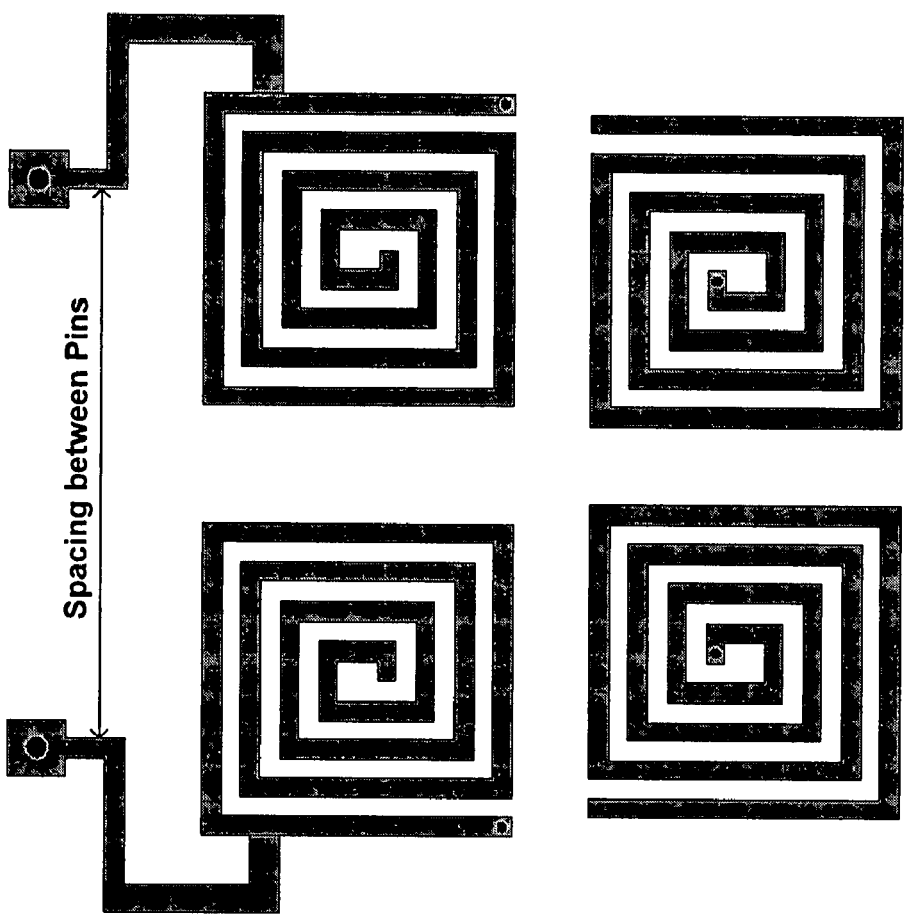
FIG. 17 illustrates the arrangement of input and output pins of the bandpass filter of the present invention.

FIG. 17 illustrates the importance of proper spacing of input/output pins. The input/output pins should be as close as possible to reduce thermal expansion effects, and the possibility of solder joint cracking. However, if spacing is too close, the input signal will directly couple to the output pins, and will cause interference. This will degrade the performance of the filter.

Figure 18:
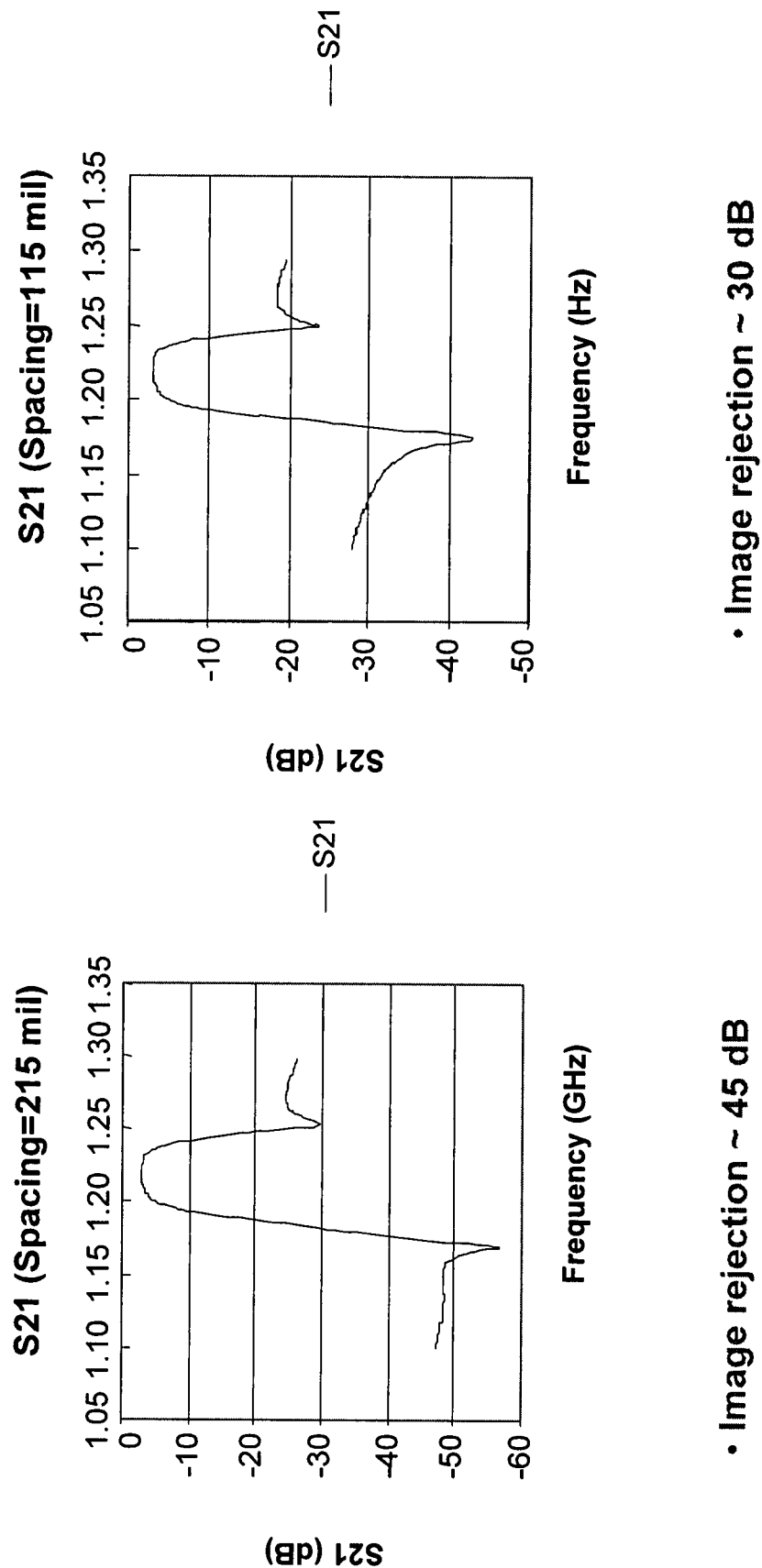
FIG. 18 shows an S-parameter for two different spacing values between two resonators.

FIG. 18 illustrates the S parameter between the input and output pins. As may be seen from the graphs of FIG. 18, the appropriate spacing is approximately 200 mils, or perhaps slightly greater. Cutting a slot between the input and output pins may reduce the coupling, allowing them to be brought closer to together.

With the filter 700 illustrated in FIG. 7, a four pole elliptical function cross coupled filter may be implemented, having a size as small as 0.6 inches by 0.6 inches, which is less than one-tenth of the wavelength. The bandwidth of this filter is approximately 40 MHz, between 1199 MHz and 1240 MHz. The insertion loss is less than 3 dB and image rejection is greater than 40 dB.

Figure 19:
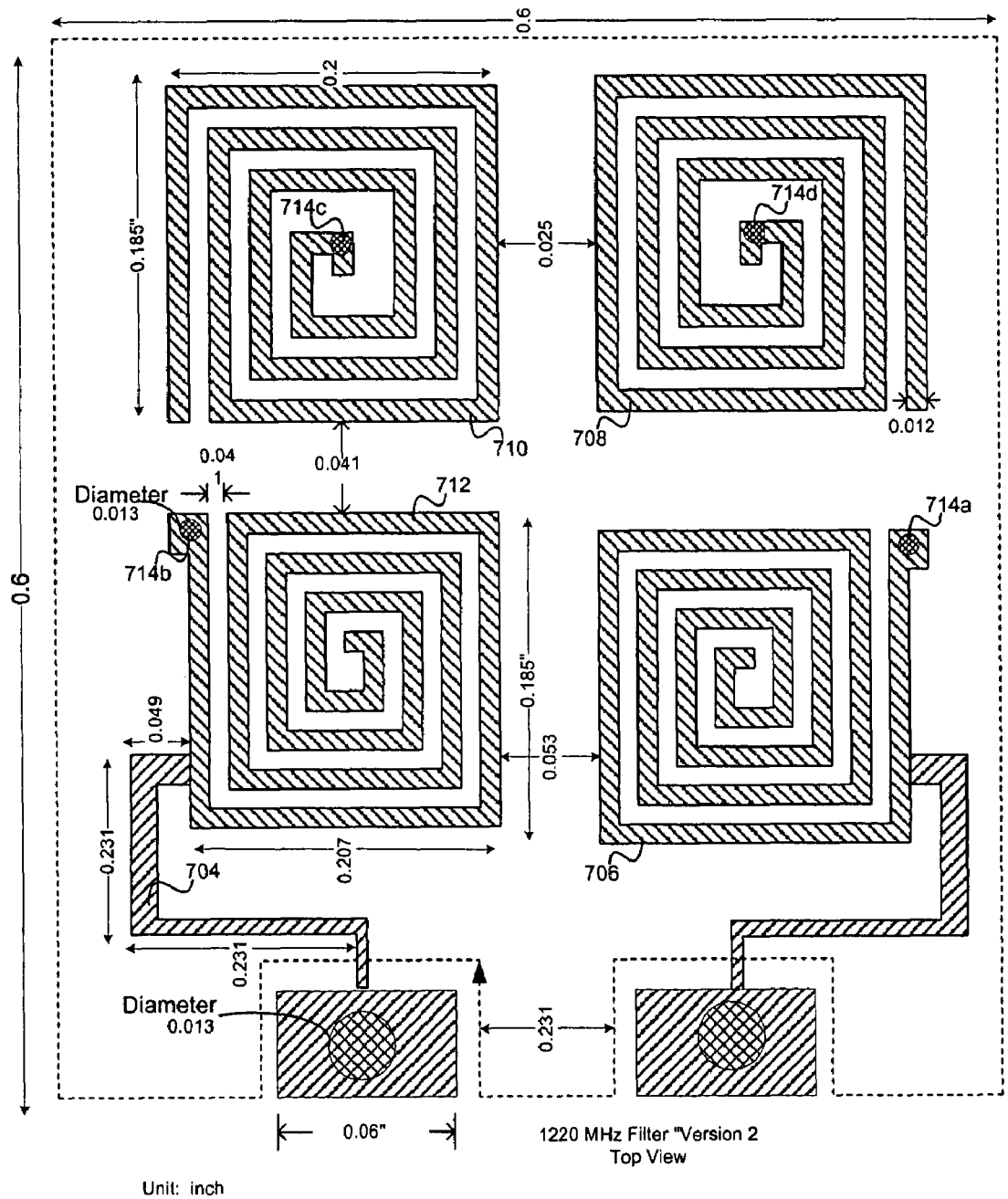
FIG. 19 shows exemplary dimensions of one embodiment of a bandpass filter of the present invention.

FIG. 19 illustrates an example of the filter of FIG. 7, with exemplary dimensions shown.

Figure 20:
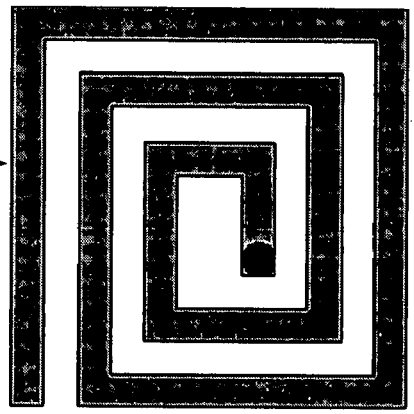
FIG. 20 illustrates a three-resonator bandpass filter.
Figure 20:
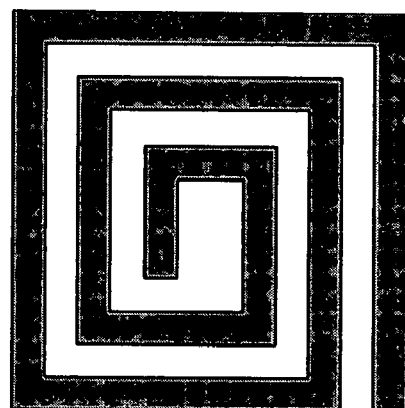
Figure 20:
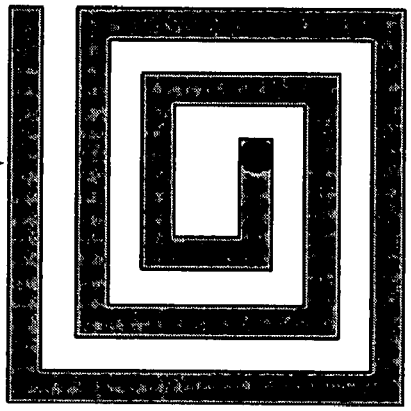
Figure 20:
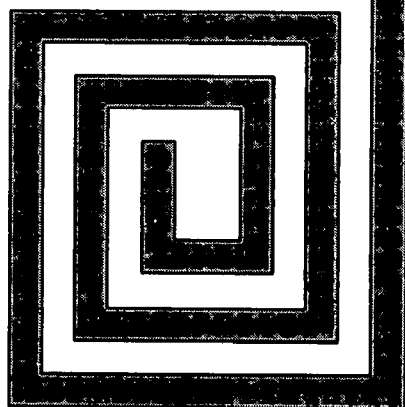

FIG. 20 illustrates a bandpass filter 2000 using two quarter-wavelength resonators 2001, 2002, and a half-wavelength resonator 2003. It will also be appreciated that more than four resonators may be included to synthesize the filter. The advantage would be the sharper frequency response. However, the filter will typically occupy a larger area, cost more, and potentially suffer from thermal expansion mismatch problems.

A circular spiral resonator can be used as well. The purpose of using the "spiral" shape is to minimize the area. Both the square and circular spiral consume about the same area.

"Interleaved" spirals might be another way to implement this type of filter. However, the "interleaved" spirals will usually make the coupling too strong, which means the coupling coefficient will be too large. If the goal is to design a narrowband filter, the coupling coefficient has to be small. However, the "interleaved" spirals may be used for a wideband filter.

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A bandpass filter comprising:
   a plurality of resonators;
   an input pin connected to a first resonator of the plurality of resonators; and
   an output pin connected to a second resonator of the plurality of resonators,
   wherein the first and second resonators are magnetically coupled to each other such that a coupling coefficient between the first and second resonators is negative, indicating out-of-phase coupling,
   wherein the first and second resonators are coupled to other resonators using mixed coupling, and
   wherein the other resonators are coupled to each other using electric coupling such that a coupling coefficient between the other resonators is positive, indicating in-phase coupling.

2. The bandpass filter of claim 1, wherein the plurality of resonators are arranged in a square array.

3. The bandpass filter of claim 1, wherein the resonators are approximately quarter-wavelength transmission lines.

4. The bandpass filter of claim 3, wherein the quarter-wavelength transmission lines are microstrip transmission lines printed in a spiral pattern.

5. The bandpass filter of claim 1, wherein the resonators are spiral resonators.

6. The bandpass filter of claim 1, wherein the bandpass filter consists solely of transmission lines.

7. The bandpass filter of claim 1, wherein the input and output pins and the resonators form a C-shaped structure.

8. The bandpass filter of claim 1, wherein the overall size of the bandpass filter is substantially less than one wavelength in any direction.

9. The bandpass filter of claim 1, wherein the bandpass filter has attenuation at an image frequency below a local oscillator frequency.

10. The bandpass filter of claim 1, wherein the bandpass filter has attenuation at an image frequency above a local oscillator frequency.

11. The bandpass filter of claim 1, wherein the resonators are arranged on a printed circuit board.

12. The bandpass filter of claim 11, wherein the printed circuit board includes a low variation dielectric.

13. The bandpass filter of claim 11, wherein the printed circuit board has a dielectric constant variability of less than 2%.

14. The bandpass filter of claim 11, wherein the printed circuit board includes GML-1000.

15. A bandpass filter comprising:
   a first resonator magnetically coupled to a second resonator such that a coupling coefficient between the first and second resonators is negative, indicating out-of-phase coupling;

a third resonator electrically coupled to a fourth resonator such that a coupling coefficient between the third and fourth resonators is positive, indicating in-phase coupling, wherein the third and fourth resonators are coupled to the first and second resonators, respectively, using mixed coupling; and an input pin and an output pin connected to the first and second resonators, respectively.

16. The bandpass filter of claim 15, wherein the first, second, third and fourth resonators are arranged in a square array.

17. The bandpass filter of claim 15, wherein the first, second, third, and fourth resonators are approximately quarter-wavelength transmission lines.

18. The bandpass filter of claim 17, wherein the quarter-wavelength transmission lines are microstrip transmission lines printed in a spiral pattern.

19. The bandpass filter of claim 15, wherein the first, second, third, and fourth resonators are spiral resonators.

20. The bandpass filter of claim 15, wherein the bandpass filter consists solely of transmission lines.

21. The bandpass filter of claim 15, wherein the input and output pins and the first, second, third, and fourth resonators form a C-shaped structure.

22. The bandpass filter of claim 15, wherein the overall size of the bandpass filter is substantially less than one wavelength in any direction.

23. The bandpass filter of claim 15, wherein the bandpass filter has attenuation at an image frequency below a local oscillator frequency.

24. The bandpass filter of claim 15, wherein the bandpass filter has attenuation at an image frequency above a local oscillator frequency.

25. The bandpass filter of claim 15, wherein the first, second, third, and fourth resonators are arranged on a printed circuit board.

26. The bandpass filter of claim 25, wherein the printed circuit board includes a low variation dielectric.

27. The bandpass filter of claim 25, wherein the printed circuit board has a dielectric constant variability of less than 2%.

28. The bandpass filter of claim 25, wherein the printed circuit board includes GML-1000.

29. A method of making a bandpass filter, comprising:
arranging a plurality of resonators in an array;
connecting an input pin to a first resonator of the plurality of resonators;
connecting an output pin to a second resonator of the plurality of resonators;
magnetically coupling the first and second resonators to each other such that a coupling coefficient between the first and second resonators is negative, indicating out-of-phase coupling;
coupling the first and second resonators to other resonators using mixed coupling; and
electrically coupling the other resonators to each other such that a coupling coefficient between the other resonators is positive, indicating in-phase coupling.

* * * * *

UNITED STATES PATENT AND TRADEMARK OFFICE
CERTIFICATE OF CORRECTION

| | | |
|---|---|---|
| PATENT NO. | : 7,567,153 B2 | Page 1 of 1 |
| APPLICATION NO. | : 11/892097 | |
| DATED | : July 28, 2009 | |
| INVENTOR(S) | : Sung-Hsien Chang | |

It is certified that error appears in the above-identified patent and that said Letters Patent is hereby corrected as shown below:

On the Title Page, Item (75), Inventors' Section, please replace "Lawrenece" with --Lawrence--.

Signed and Sealed this

Second Day of March, 2010

David J. Kappos
*Director of the United States Patent and Trademark Office*